United States Patent [19]

Suzuki et al.

[11] 4,356,411

[45] Oct. 26, 1982

[54] FLIP-FLOP CIRCUIT

[75] Inventors: Yasoji Suzuki, Kawasaki; Minoru Takada, Ohmori Nishi, both of Japan

[73] Assignee: Tokyo Shibaura Denki Kabushiki Kaisha, Japan

[21] Appl. No.: 101,103

[22] Filed: Dec. 7, 1979

[30] Foreign Application Priority Data

| Dec. 12, 1978 | [JP] | Japan | 53-153536 |
| Dec. 12, 1978 | [JP] | Japan | 53-153537 |
| Dec. 12, 1978 | [JP] | Japan | 53-153539 |
| Dec. 12, 1978 | [JP] | Japan | 53-153540 |

[51] Int. Cl.³ .......................................... H03K 3/289
[52] U.S. Cl. ................................ 307/272 A; 307/279
[58] Field of Search .............. 307/272 A, 279, 288, 307/291, 221 C, 223 C; 365/181, 182, 188

[56] References Cited

U.S. PATENT DOCUMENTS 3,440,449 4/1969 Priel et al. ................. 307/272 A
3,591,856 7/1971 Kalb ............................ 307/272 A

*Primary Examiner*—John Zazworsky
*Attorney, Agent, or Firm*—Finnegan, Henderson, Farabow, Garrett & Dunner

[57] ABSTRACT

Disclosed is a flip-flop circuit capable of high speed and of low power consumption which has a master flip-flop including a logic gate circuit, and a slave flip-flop circuit also including a logic gate circuit, and a means for supplying a preset signal or a clear signal to the logic gate circuit of the slave flip-flop circuit or to an output logic circuit. Specifically, a binary type flip-flop circuit with preset/clear functions suitable for a ring counter and a ripple counter, and assembled by means of integrated circuit technology, is disclosed.

10 Claims, 40 Drawing Figures

F I G. 17
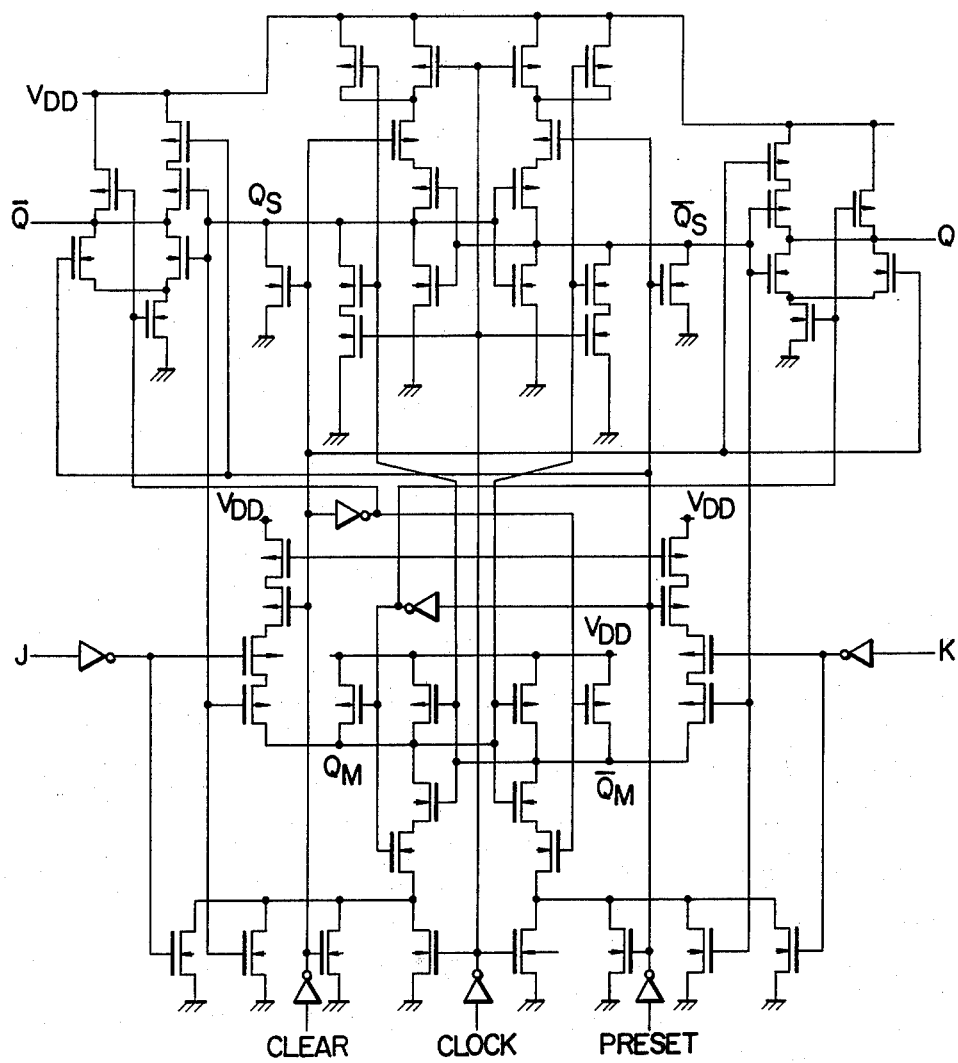

PRESET CLOCK CLEAR

F I G. 21
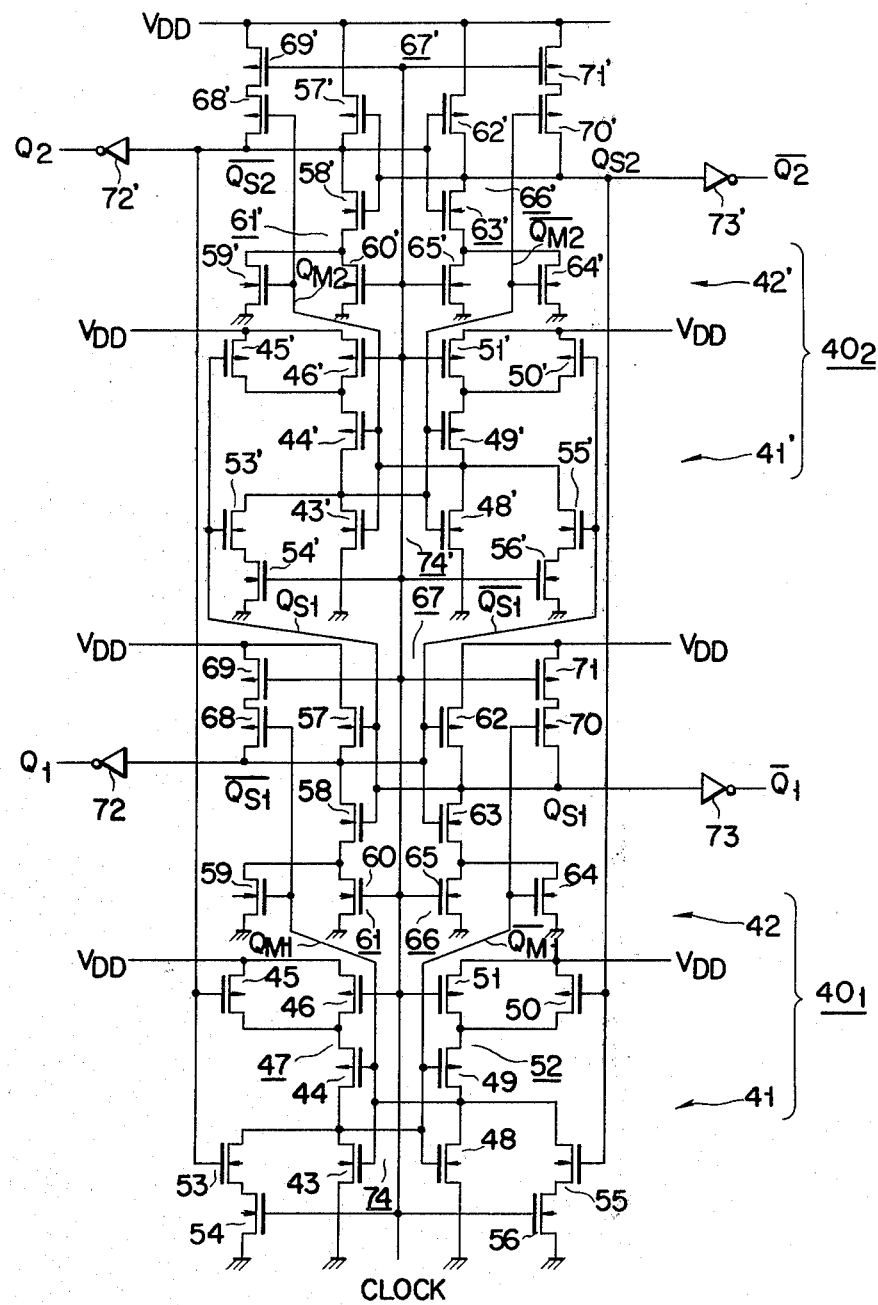

F I G. 32
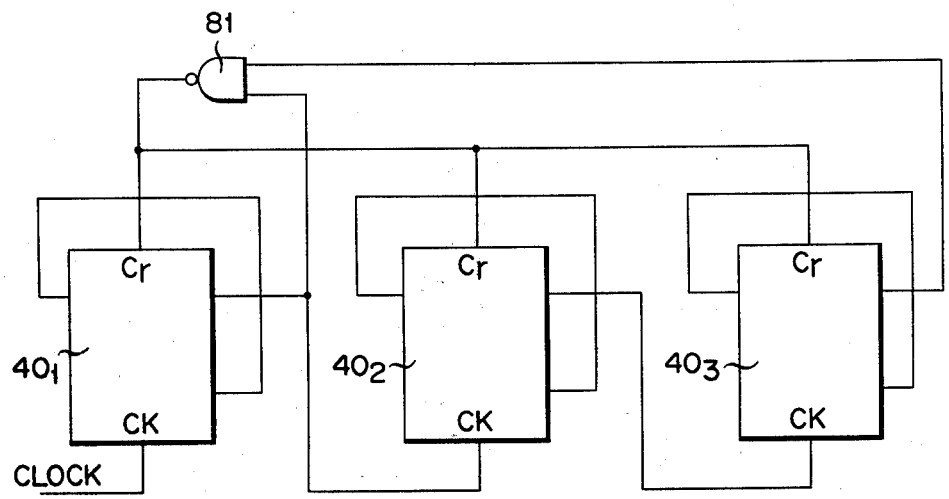
F I G. 33
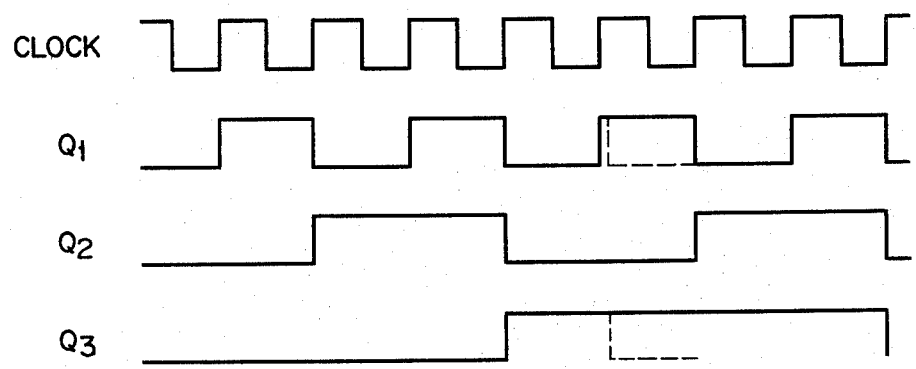

F I G. 34
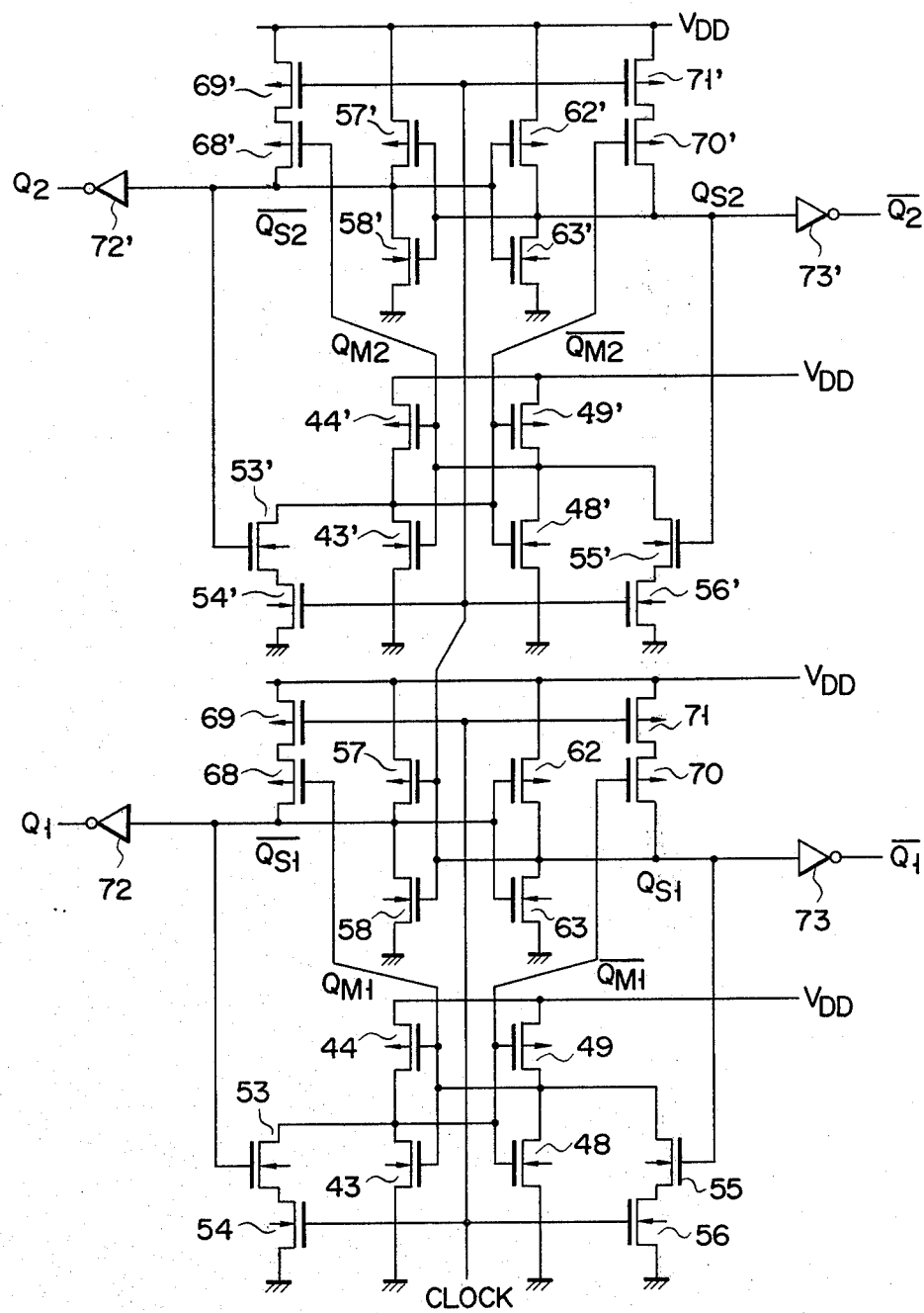

FLIP-FLOP CIRCUIT

BACKGROUND OF THE INVENTION

The invention relates to a flip-flop circuit adapted for an integrated circuit fabrication and, more particularly, a binary type flip-flop circuit with a preset/clear function adapted for a counter.

The present applicant proposed a J-K flip-flop circuit which responds to a preset or a clear input signal to produce proper output signals Q and $\overline{Q}$, independently of a J input signal, a K input signal and a clock signal. Such a J-K flip-flop circuit is shown in FIG. 1. Let us first consider a case where a preset signal is applied to the J-K flip-flop circuit. When neither a preset signal nor a clear signal is applied thereto, Preset="1" and Clear="1" in the circuit. If the preset is applied to such a flip-flop, Preset="0", so that the output of the inverter 1 is "1", the output of a NOR gate 2 is "0" and accordingly, the output Q is "1". The output of an inverter 3 is "0" and hence the output $Q_M$ of a NAND gate 4 is "1". Since the clear input CLEAR is "1", the output of an inverter 5 is "0" and the output of the inverter 6 is "1". Since the output of the inverter 1 is "1", the output of the OR gate is "1" and therefore all the inputs of a NAND gate 8 is "1". Accordingly, the output $Q_M$ is "0". Hence, the output of the AND gate 9 is "0" and the inputs of a NOR gate 10 are all "0", so that the output Qs is "1" and the output $\overline{Q}$ is "0". Thus, in order to establish Q (output)=1 upon the actuation of the preset, only the inverter 1, the NOR gate 2, and the inverter 11 are used. To establish $\overline{Q}$ (output)=0, six-stage gates are needed, such as the inverters 1 and 3, the NAND gates 4 and 8, the NOR gate 10 (including AND gate 9) and the inverter 12. As seen from the gates 1 to 17, the upper half and the lower half in the circuit in FIG. 1 are symmetrical with each other in the circuit construction. Therefore, it will be easily understood that the operation of preset is correspondingly applied to the clear operation.

As described above, only the response time corresponding to three-stages of gates is taken for the time that the preset and clear input signals are applied to the corresponding terminals of the flip-flop circuit till the given levels of the output Q or $\overline{Q}$ is established. The response time for the establishment of the antiphase outputs $\overline{Q}$ or Q must correspond to six-stages of gates, however. The six-stage response time eventually defines the response time of the flip-flop circuit shown in FIG. 1 when the preset and clear terminals are actuated in the circuit.

Let us consider a response time of the circuit of FIG. 1 for the clock input CLOCK. Since the circuit is "1" active for the clock input, the response time of the output terminals Q and $\overline{Q}$ may be that corresponding to two stages of gates, the NOR gate 2 and the Inverter 11 or the NOR gate 10 and the INVERTER 12, if the outputs $Q_M$ and Q have been established during the period that the clock input=0.

The recent goals in the field of integrated circuitry are a speed-up of the operation speed and a reduction of the power consumption of the integrated circuit. In the FIG. 1 circuit, even if the operation speed is improved, the difference between the numbers of gate stages in establishing the outputs Q and $\overline{Q}$ hinders the speed-up of the system requiring the preset or the clear actuation. When such a system is constructed by single channel type MOS transistors, the period to establish both the outputs Q and $\overline{Q}$ includes the period that both the outputs have the same level. During the period, a DC path is formed in the output portion of the system to consume superfluous current.

Another conventional binary type flip-flop circuit of CMOS (complementary MOS) is shown in FIG. 2. In the figure, P-channel MOS transistors 201 and 202, and N-channel MOS transistors 203 and 204 constitute a clocked inverter 221 which generates an inverted signal upon receipt of a clock signal CK or $\overline{CK}$. A P-channel transistor 205 and an N-channel transistor 206 form an inverter 222. P-channel transistors 207 and 208, and N-channel transistors 209 and 210 form a clocked inverter 223 as a feedback circuit. P-channel transistors 211 and 212 and N-channel transistors 213 and 214 form a clocked inverter 224. A P-channel transistor 215 and an N-channel transistor 216 form an inverter 225. The P-channel transistors 217 and 218, and N-channel transistors 219 and 220 form a clocked inverter 226 as a feedback circuit. Inverters 227 and 228 form a buffer circuit to obtain the outputs Q and $\overline{Q}$ of the flip-flop circuit. A P-channel transistor 229 and an N-channel transistor 230 form an inverter 231 to obtain clock signals (timing signals) CK and $\overline{CK}$ to control the respective clocked inverters.

In the circuit shown in FIG. 2, an initial state is assumed such that the clock signal=0, the output Qs of the clocked inverter 224 is 1, $\overline{Q}s$=1, and the output A of the clocked inverter 221 is 1, A=1. Under this condition, the P-channel transistor 201 and the N-channel transistor 204 are both OFF, thus rendering the clocked inverter 221 inoperative. Since the transistors 207 and 210 are both ON, the clocked inverter 223 is in an operating condition. Both the transistors 211 and 214 are ON, so that the clocked inverter 224 operates. Both the transistors 217 and 220 are OFF, so that the clocked inverter 226 is inoperative. Accordingly, the inverters 222 and 223 cause the output A to hold "1" and the output B to hold "0" during a period that the clock signal CK=0.

The operating condition of the clocked inverter 224 causes the output Qs to hold "1" and the inverter 225 causes the output $\overline{Q}s$ to hold "0". When the clock signal CK becomes "1", the clocked inverters 221 and 226 operate while the clocked inverters 223 and 224 are inoperative. The result is that Qs is "1" and the operation of the clocked inverter 221 causes the output A to change from "1" to "0" while causing the output B to change from "0" to "1". Since the clocked inverter 226 is in operating condition and the clocked inverter 224 is in non-operating condition, Qs holds "1" and $\overline{Q}s$ holds "0".

When the clock signal CK changes from "1" to "0", the clocked inverters 221 and 226 are inoperative and the clocked inverters 223 and 224 operate. Since the output B is "1", the clocked inverter 224 operates and therefore the output Qs changes from "1" to "0" in synchronism with the trailing edge of the clock signal. A similar operation is repeated subsequently in the circuit of FIG. 3, so that the operation of the circuit operation of the FIG. 2 circuit may be diagrammatically illustrated in FIG. 3.

Generally, one of the features of the CMOS circuit is that it can operate with small power consumption and at high speed. It, however, encounters problems in its use in frequencies ranging several MHz to several tens MHz for the reason to be described later. For this reason, the CMOS circuit has rarely been used for a super-high speed system. In the present day the CMOS circuit is widely used, since it has a low power consumption, its noise margin is wide, and its range of usable power source voltage is wide. The CMOS circuit has gradually been used in a system requiring a high speed operation such as a television system. Accordingly, to design a CMOS integrated circuit with low power consumption and at extremely high speed, the individual MOS transistors and the circuit per se must both be speeded up in the operation.

Let us consider a response time of the output Qs and $\overline{Qs}$ for the clock input signal CK in FIG. 2. It is when the clocked inverter 224 operates that the output Qs and $\overline{Qs}$ change. To fully operate the inverter 224, the clock signals CK and $\overline{CK}$ must be given to the gates of the transistors 211 and 214. To this end, the inverter 231 for clock generation must operate. Accordingly, the output Qs for the clock CK takes a response time corresponding to two stages of the transistors of the inverters 231 and 224 while the output $\overline{Qs}$ takes a response time corresponding to three stages of transistors of the inverters 231, 224 and 225. That is to say, in the FIG. 2 circuit, the response time corresponding to at least three stages of the MOS transistors is required for the outputs Qs and $\overline{Qs}$ to settle down to have proper levels in response to the clock input CK.

In the circuit in FIG. 2, the clock signal $\overline{CK}$ has a delay of one stage of the inverter 231 with respect to the clock signal CK and hence a race condition tends to occur. This will be described in detail with reference to FIG. 2. Assume now that the clock signal CK is "0", the output A is "1", the output B is "0", and the output Qs is "1". When the clock signal CK changes from "0" to "1", the output Qs is "1" and the transistor 203 is turned on, and the clock signal CK becomes "1" to turn on the transistor 204. As a result, the output A changes from "1" to "0" and the output B changes from "0" to "1". When the clock signal CK becomes "1", the clock signal $\overline{CK}$ delays by the response time of the inverter 231 without fail and during the period, the transistor 214 of the clocked inverter 224 is turned on. It is necessary to avoid such a case that, when the output B becomes 1 under this condition, the transistor 213 is turned on, the clocked inverter 224 is turned off and the output B is transferred to the output Qs.

Nevertheless, since the transistors 213 and 214 are turned on, the output Qs changes from "1" to "0". This phenomenon is called a "race". A may be avoided by shortening the response time of the inverter 231. The clock signals CK and $\overline{CK}$ both drive a number of MOS transistors so that a great amount of capacity is needed. Accordingly, the transistors 229 and 230 must be very large, in order to prevent the race. This particularly tends to occur when high speed MOS transistors are used for the circuit construction. If large transistors are used for the transistors 229 and 230 of the inverter 231, the inverter 231 consumes a large amount of power and since the input is the clock signal CK, it greatly influences the power consumption of the overall integrated circuit and reduces the density of integration.

Accordingly, an object of the invention is to provide a flip-flop circuit with a preset/clear function which is operable at a high speed and with small power consumption.

Another object of the invention is to provide a binary flip-flop with preset/clear function which is adapted for an integrated circuit fabrication, a ring counter and a ripple counter.

According to one aspect of the invention, there is provided a master flip-flop in which the input and output terminals of a first logic gate circuit are connected to the output and input terminals of a second logic gate circuit, respectively, a slave flip-flop in which the input and output terminals of a third logic gate circuit are connected to the output and input terminals of a fourth logic gate circuit, respectively, and first and second outputs from the master flip-flop are applied to first and second input terminals thereof, and means for applying a preset input or a clear input to the third and fourth logic circuits.

According to another aspect of the invention, there is provided a flip-flop circuit comprising a master flip-flop having a first flip-flop element in which the input and output terminals of a first CMOS inverter are connected to the output and input terminals of a second CMOS inverter, respectively, a first series circuit having first and second MOS transistors of the first channel type connected in series between the output terminal of the first CMOS inverter and a first potential supply terminal, and a second series circuit having third and fourth MOS transistors of the first channel type connected in series between the output terminal of the second CMOS inverter and the first potential supply terminal; a slave flip-flop having a second flip-flop element in which the input and output terminals of a third CMOS inverter are connected to the input and output terminals of a fourth CMOS inverter, respectively, a third series circuit having fifth and sixth MOS transistors of a second channel type connected in series between the output terminals of the third CMOS inverter and a second potential supply terminal, and a fourth series circuit having seventh and eighth MOS transistors of the second channel type connected in series between the output terminal of the fourth CMOS inverter and the second potential supply terminal; wherein a timing pulse is applied to the second, fourth, sixth, and eighth MOS transistors, the output signal of the first CMOS inverter is applied to the gate of the seventh MOS inverter, the output signal of the second CMOS inverter is applied to the gate of the fifth MOS transistor, the output signal of the third CMOS inverter is applied to the gate of the first MOS transistor, and the output signal from the CMOS inverter is applied to the third MOS transistor.

Other objects and features of the invention will be apparent from the following description taken in connection with the accompanying drawings, in which:

BRIEF DESCRIPTION OF THE DRAWINGS

FIG. 17 shows another example of the CMOS circuit used in the circuit in FIG. 16;

FIG. 21 shows another embodiment of the flip-flop circuit when the invention is employed as a binary flip-flop counter shown in FIG. 4;

FIG. 32 shows a block diagram of the circuit shown in FIG. 31;

FIG. 33 shows a set of waveforms for illustrating the operation of the circuit shown in FIG. 31; and FIG. 34 shows a circuit diagram of the simplified circuit shown in FIG. 28.

DETAILED DESCRIPTION OF THE PREFERRED EMBODIMENTS

Figure 4:
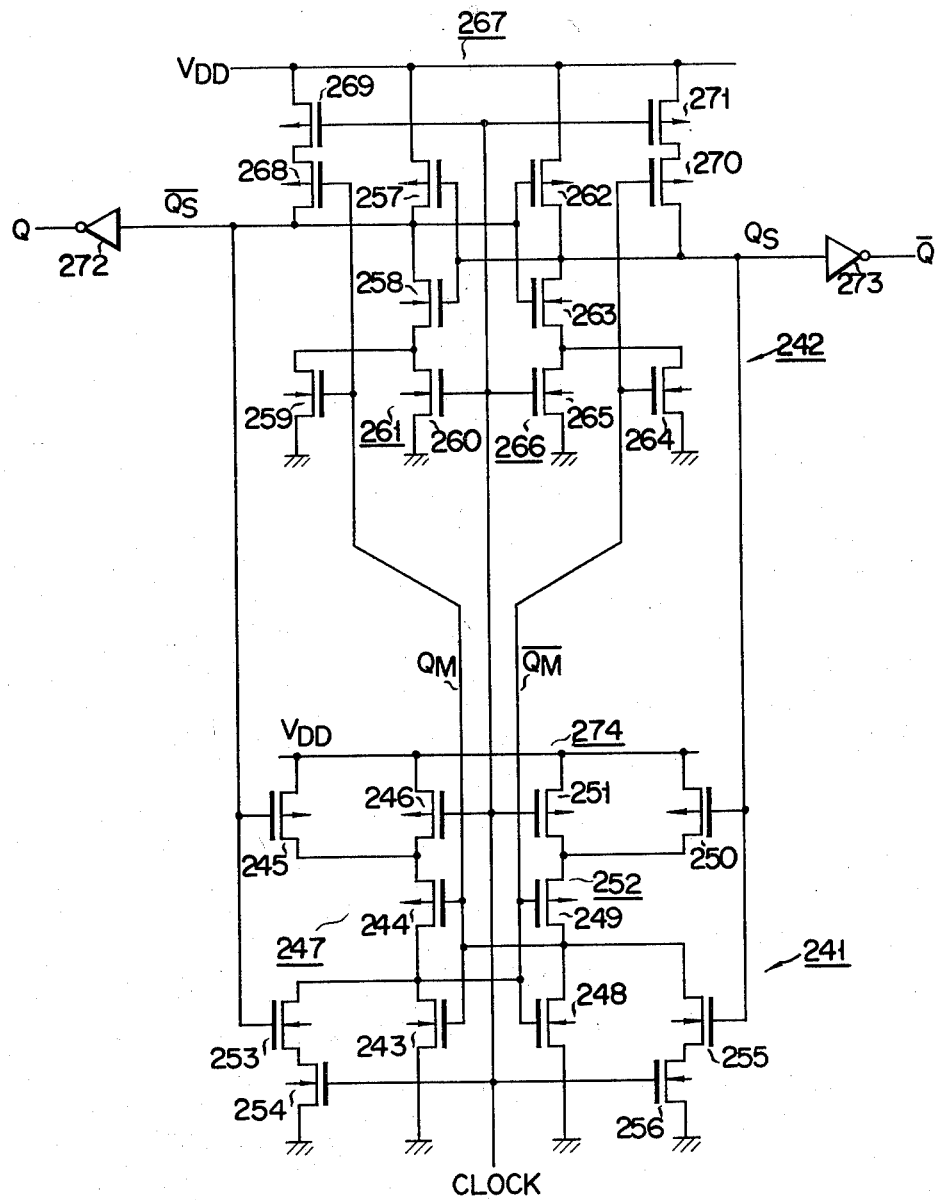
FIG. 4 shows a circuit diagram of an embodiment of a flip-flop circuit according to the invention when it is applied for a trailing-edge synchronizing binary flip-flop of which the output changes at the trailing edge of a clock signal.

The invention will be described in detail with reference to the accompanying drawings. FIG. 4 shows a circuit diagram of an embodiment of the invention when the flip-flop circuit of the invention is utilized as a binary flip-flop wherein the output data changes at the trailing edge of a clock signal (timing signal). The circuit shown in FIG. 4 is comprised of a master flip-flop circuit 241 and a slave flip-flop circuit 241. More specifically, in the master flip-flop circuit 242, an N-channel MOS transistor 243 and a P-channel MOS transistor 244 form a CMOS inverter body. A parallel circuit including P-channel transistors 245 and 246 is inserted in series in the CMOS inverter body thereby to form a CMOS inverter 247. A combination of an N-channel transistor 248, and a P-channel transistor 249 forms a CMOS inverter body. A parallel circuit including P-channel transistors 250 and 251 is inserted in series in the CMOS inverter body thereby to form a second CMOS inverter 252.

The input terminal and the output terminal of the CMOS inverter 247 are coupled with the output terminal and the input terminal of the CMOS inverter 252, respectively, thereby to form a flip-flop element 274. N-channel MOS transistors 253 and 254 are connected in series between the output terminal $\overline{Q}_M$ of the CMOS inverter 247 and an earth potential supply terminal (referred to as earth). A couple of N-channel transistors 255 and 256 are connected in series between the output terminal $Q_M$ of the CMOS inverter 252 and earth.

In the slave flip-flop 242, a P-channel transistor 257 and an N-channel transistor 258 cooperate to form a CMOS inverter body. A parallel circuit including N-channel transistors 259 and 260 is inserted in series in the CMOS inverter body thereby to form a CMOS inverter 261. A P-channel transistor 262 and an N-channel transistor 263 form a CMOS inverter body. A parallel circuit including N-channel transistors 264 and 265 is inserted in series in the CMOS inverter body, thereby to form a CMOS inverter 266. The input and output terminals of the CMOS inverter 261 are coupled with the output and input terminal of the CMOS inverter 266, respectively, thereby to form a flip-flop element 267. A couple of P-channel transistors 268 and 269 are connected in series between the output terminal Qs of the CMOS inverter 261 and a $V_{DD}$ potential supply terminal (referred to as a power source $V_{DD}$). A couple of P-channel transistors 270 and 271 are connected in series between the output terminal Qs of the CMOS inverter 266 and the power source $V_{DD}$. The output terminals $\overline{Q}s$ and Qs provide flip-flop outputs Q and $\overline{Q}$ through inverters 272 and 273, respectively.

The gates of the transistors 246, 251, 254, 256, 260, 265, 269 and 271 are connected to a clock signal supply terminal for supplying a clock signal clock. The output terminal $\overline{Q}_M$ of the CMOS inverter 247 is connected to the gates of the transistors 264 and 270. The output terminal $Q_M$ of the inverter 252 is connected to the gates of transistors 259 and 268. The output terminal Qs of the inverter 261 is connected to the gate of transistors 245 and 253 and the output terminal Qs of an inverter 266 is connected to the gates of transistors 250 and 255.

The operation of the circuit shown in FIG. 4 will be described. In this case, the following initial state is assumed: Clock=0, Qs=1 and $Q_M$=1. When the Clock changes from "0" to "1", the transistor 256 is turned on and the transistor 255 is on since the output Qs is "1". Accordingly, the output $Q_M$ changes from "1" to "0". As a result, the transistor 268 is turned on but the transistor 269 is turned off because the Clock is "1", so that the output $\overline{Qs}$ holds "0" and the output Qs holds "1". The transistor 244 is turned on because $Q_S$ changes from "1" to "0", and the transistor 245 is on because $\overline{Q_S}$ holds "0" so that the output $\overline{Q_M}$ changes from "0" to "1." Then, when the clock changes from "1" to "0", the transistor 269 is turned on and the transistor 268 is on since the output $\overline{Q_M}$ is "0." As a result, the output Q changes from "0" to "1." The transistor 263 is turned on since the $\overline{Q_S}$ is "1" and the transistor 264 is on because the output $Q_M$ is "1." As a result, the output $Q_S$ changes from "1" to "0." When the above-mentioned operation is repeated, the operation waveforms are formed as shown in FIG. 3. Accordingly, the circuit shown in FIG. 4 operates like the circuit in FIG. 2. The following table is a truth table tabulating the operation of the circuit shown in FIG. 4. In the table, the upper row indicates the leading-edge synchronizing binary flip-flop and the lower row indicates the trailing-edge synchronizing binary flip-flop.

| Clock | Qn+1 | $\overline{Qn+1}$ |
|---|---|---|
| 1 → 0 | $\overline{Qn}$ | Qn |
| 0 → 1 | $\overline{Qn}$ | Qn |

Figure 2:
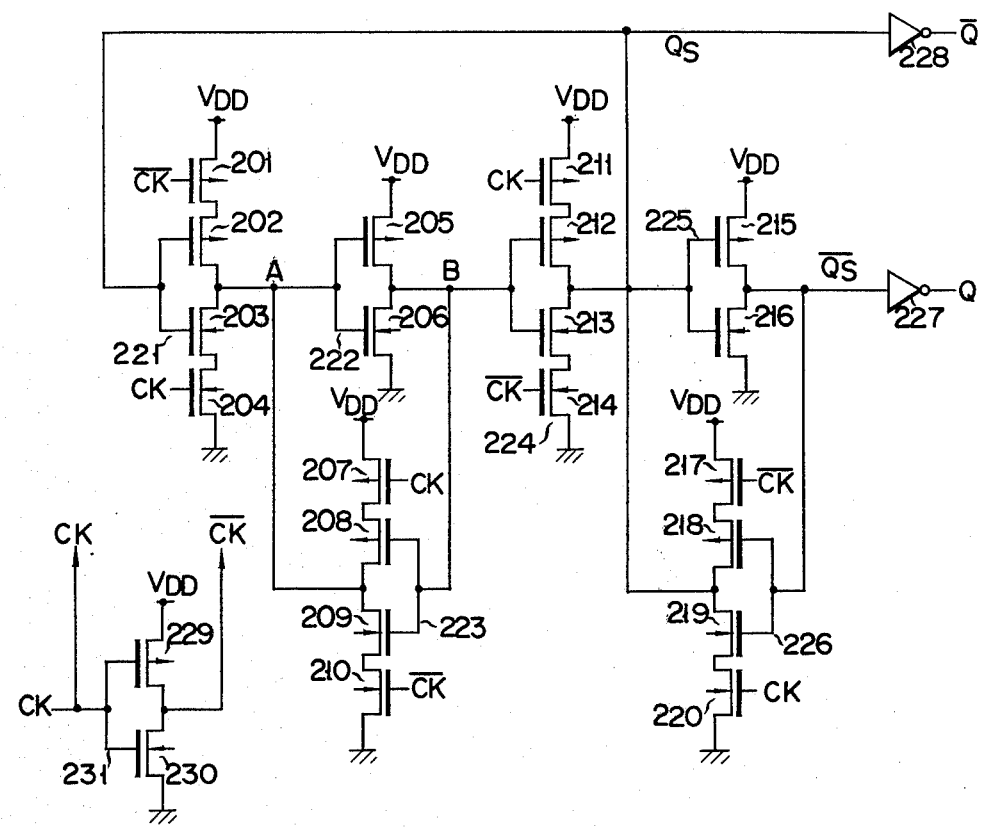
FIG. 2 shows a circuit diagram of a conventional binary flip-flop circuit.
Figure 3:
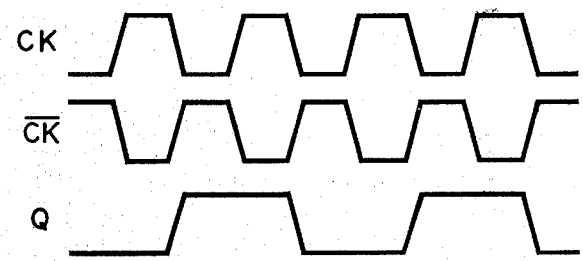
FIG. 3 shows a set of signal waveforms useful in explaining the operation of the circuit shown in FIG. 2.

As seen from the above table, the circuits shown in FIGS. 2 and 4 perform similar binary flip-flop operations. When comparing both the circuits, the circuit shown in FIG. 4 does not use an opposite phase clock signal with respect to the clock signal Clock and eliminates the use of the inverter 231 using large transistors as shown in FIG. 2.

The FIG. 4 circuit is advantageous in the light of the density of integration. This feature is useful when it is applied for a system using a clock signal with a high frequency, or the system operating at a high speed. With respect to the response times of the outputs Qs and $\overline{Qs}$ for the Clock, when the $\overline{Qs}$ changes from "0" to "1", the Clock becomes "0" and the transistor 269 is merely turned on. Accordingly, the response time in this case corresponds to one stage of a transistor. At this time, Qs takes the response time corresponding to two stages of transistors since $\overline{Qs}$ becomes "1" and then changes from "1" to "0" after the transistor 263 is turned on. In the case where $\overline{Qs}$ changes from "1" to "0", the operation is completely symmetrical with that as mentioned above; however, the response time is equal to two stages of transistors. Therefore, the response time in the FIG. 4 circuit according to the invention is shorter than that of the FIG. 2 circuit by an amount corresponding to one stage of a transistor. As described above, in the FIG. 2 circuit, the use of the clock signal and the antiphase clock signal causes the race. The embodiment shown in FIG. 4 does not use the antiphase clock signal and is therefore free from the race.

Figure 5:
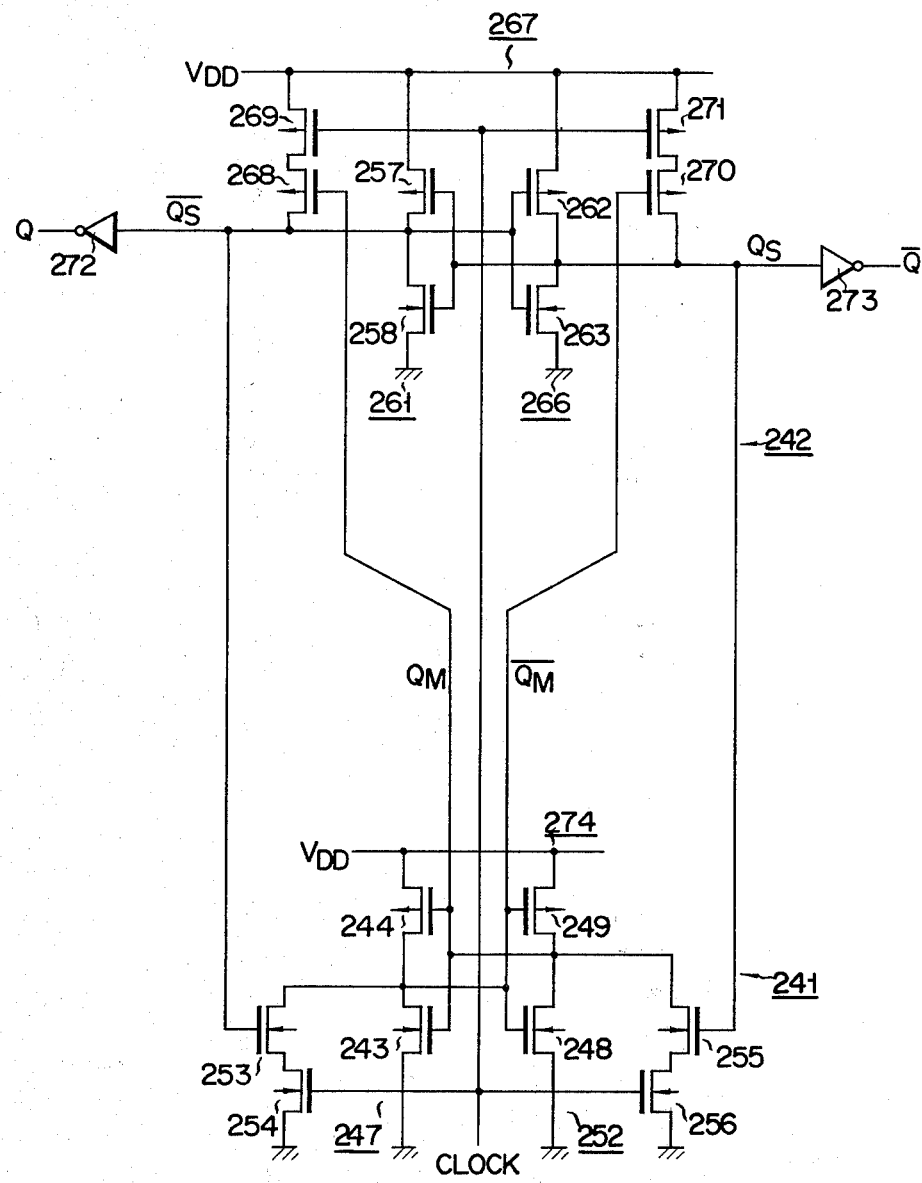
FIG. 5 shows a circuit diagram of another embodiment of the flip-flop circuit as the simplified circuit shown in FIG. 4.

FIG. 5 shows another embodiment of the flip-flop circuit according to the invention which is the simplified embodiment of FIG. 4. As shown, the transistors 245, 246, 250, 251, 259, 260, 264 and 265 in the circuit in FIG. 4 are omitted in the circuit shown in FIG. 5. The simplified circuit shown in FIG. 5 can attain the operation indicated by the truth table or the waveforms. The circuit in this embodiment is also of the trailing edge synchronizing system.

Figure 6:
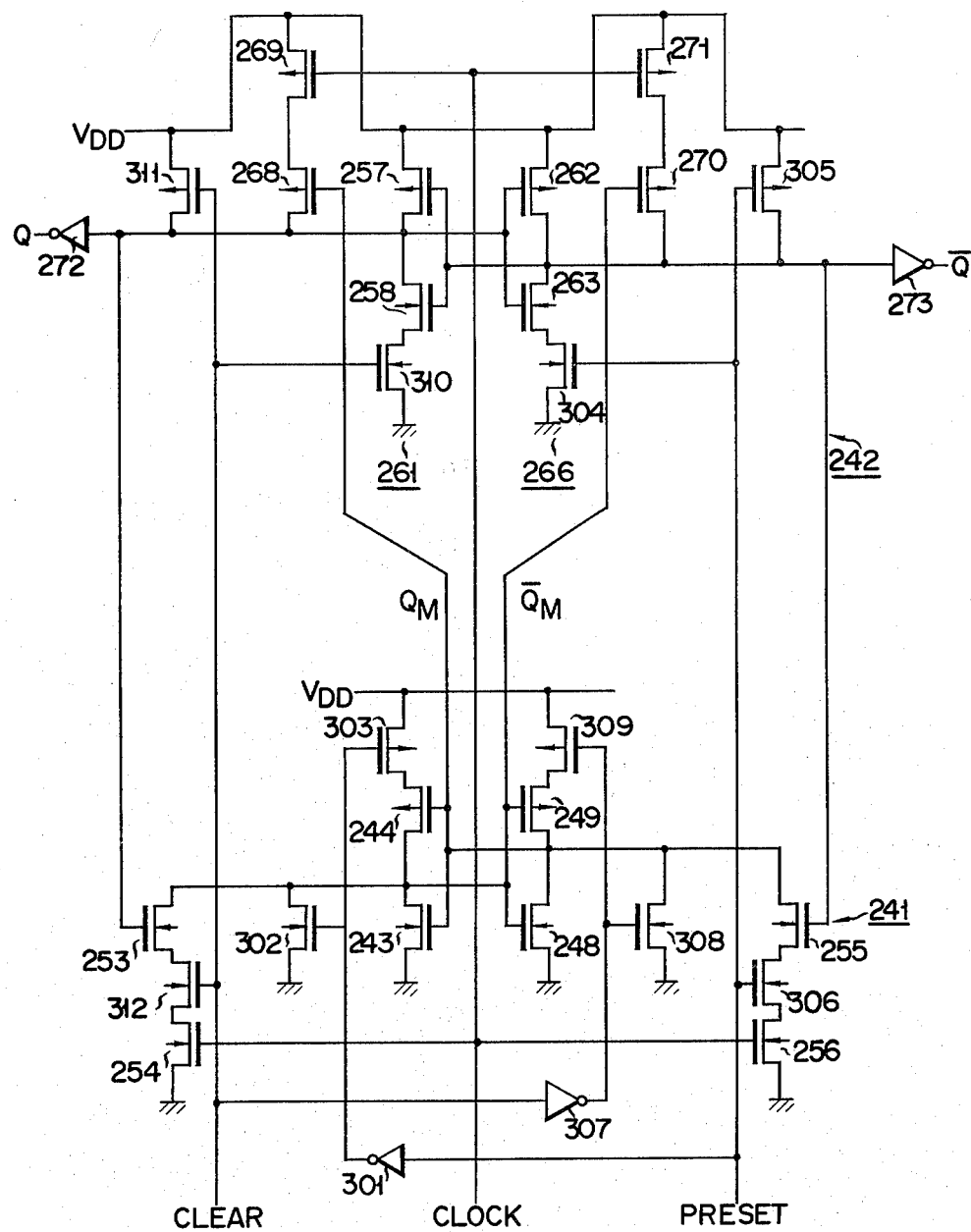
FIG. 6 shows a circuit diagram of another embodiment of the flip-flop circuit of the invention which is the circuit in FIG. 5 with a preset/clear function.

Turning now to FIG. 6, there is shown another embodiment of the flip-flop circuit according to the invention which differs from the FIG. 5 circuit in that it has preset/clear function. That is, unlike the circuit of FIG. 5, the flip-flop circuit sets up the output data Q and $\overline{Q}$ regardless of the clock signal. In the circuit shown in FIG. 6, an inverter 301 and transistors 302 to 306 relating to the Preset supply line are additionally employed and further an inverter 307 and transistors 308 to 312 are also used relating to a Clear supply line.

Figure 7:
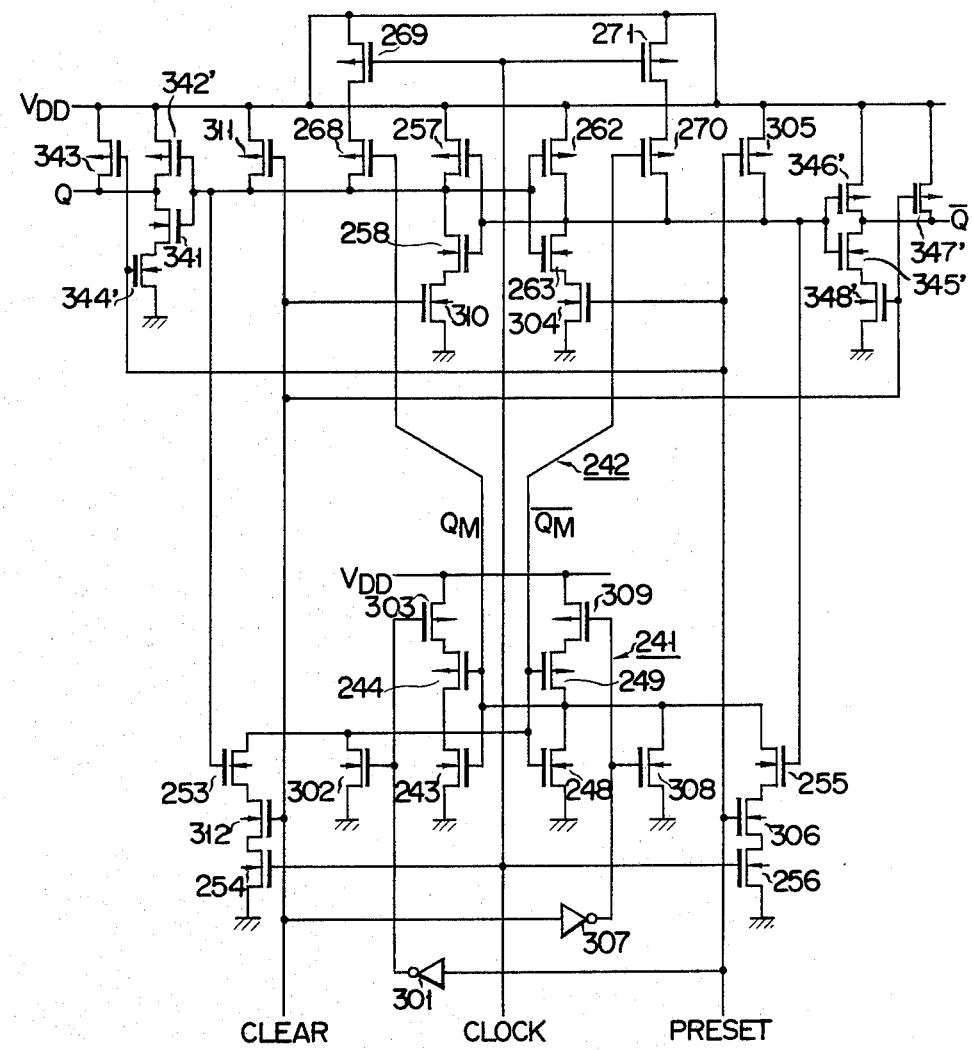
FIG. 7 shows a circuit diagram of yet another embodiment of the flip-flop circuit according to the invention which is the circuit of FIG. 6 with a preset/clear function.

FIG. 7 shows yet another embodiment of the invention which differs from the circuit of FIG. 6 in that it has an output logic section comprised of NAND gates.

Figure 8:
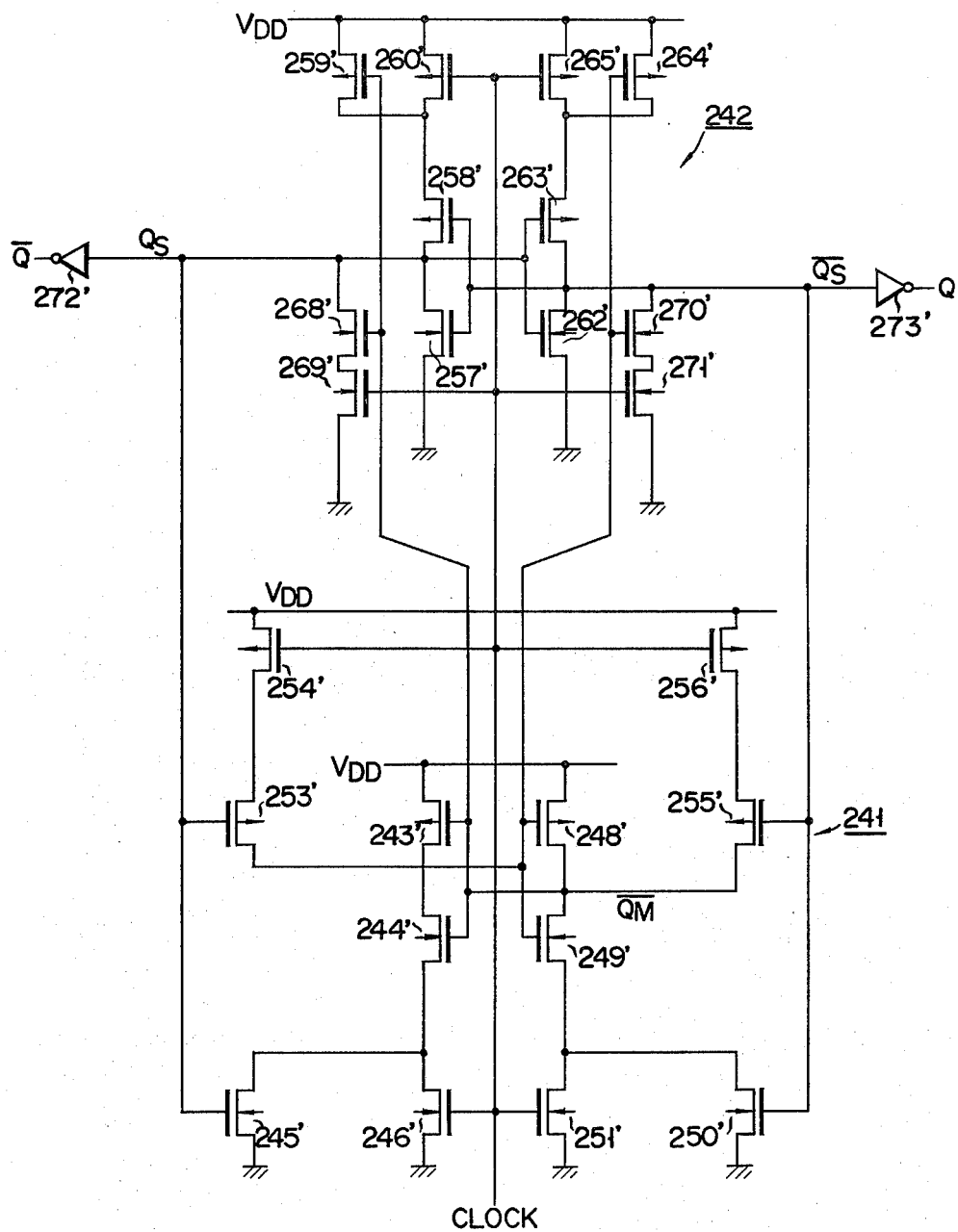
FIG. 8 shows a circuit diagram of a further embodiment of the flip-flop circuit which is a leading-edge synchronizing binary flip-flop of which the output data changes at the leading edge of a clock signal.

FIG. 8 shows a further embodiment of the invention which is a binary flip-flop of the leading edge synchronizing type of which the output data Q and $\overline{Q}$ change at the leading edge of the clock signal Clock. This embodiment is the same as the above-mentioned embodiment. Accordingly, like symbols with primes are used to designate the corresponding portions in the above-mentioned embodiment. The feature of the embodiment is to supply the clock signal Clock to the N-channel transistors 269' and 271' to change the data at the leading edge of the clock signal Clock.

Figure 9:
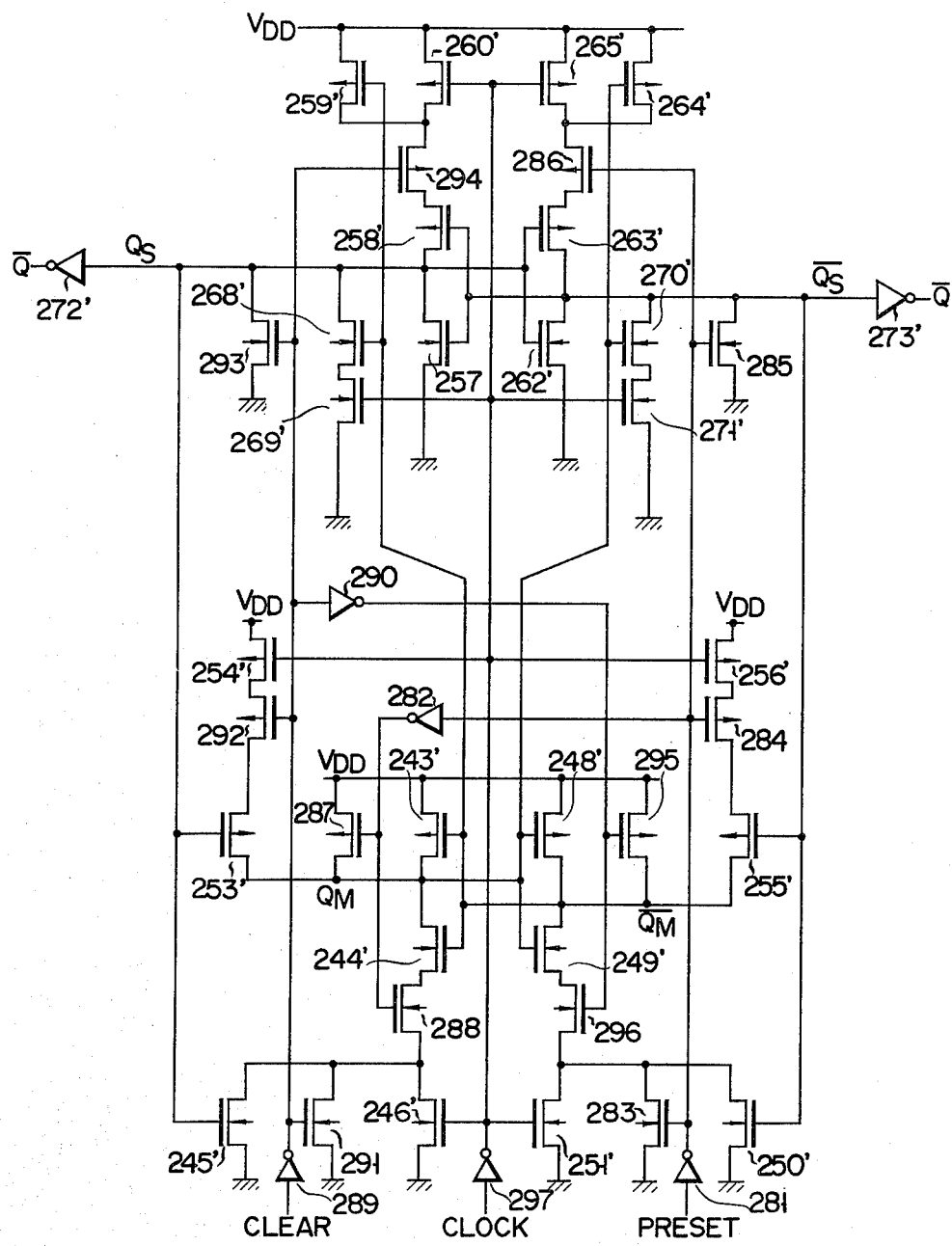
FIG. 9 shows a circuit diagram of the flip-flop circuit according to the invention which is the circuit of FIG. 8 with a preset/clear function.

An embodiment of the invention shown in FIG. 9 corresponds to the circuit in FIG. 8 of which the slave flip-flop 242 has a preset/clear function to definitely set the levels of the outputs Q and $\overline{Q}$ irrespective of the signal Clock. In the circuit shown in FIG. 9, inverters 281 and 282, and transistors 283 to 288 are provided relating to a line for supplying a preset signal Preset. Inverters 289 and 290 and transistors 291 to 296 are additionally used relating to a line for supplying a clear signal Clear. Further, an inverter 297 is additionally connected to a line for supplying a clock signal Clock.

Figure 10:
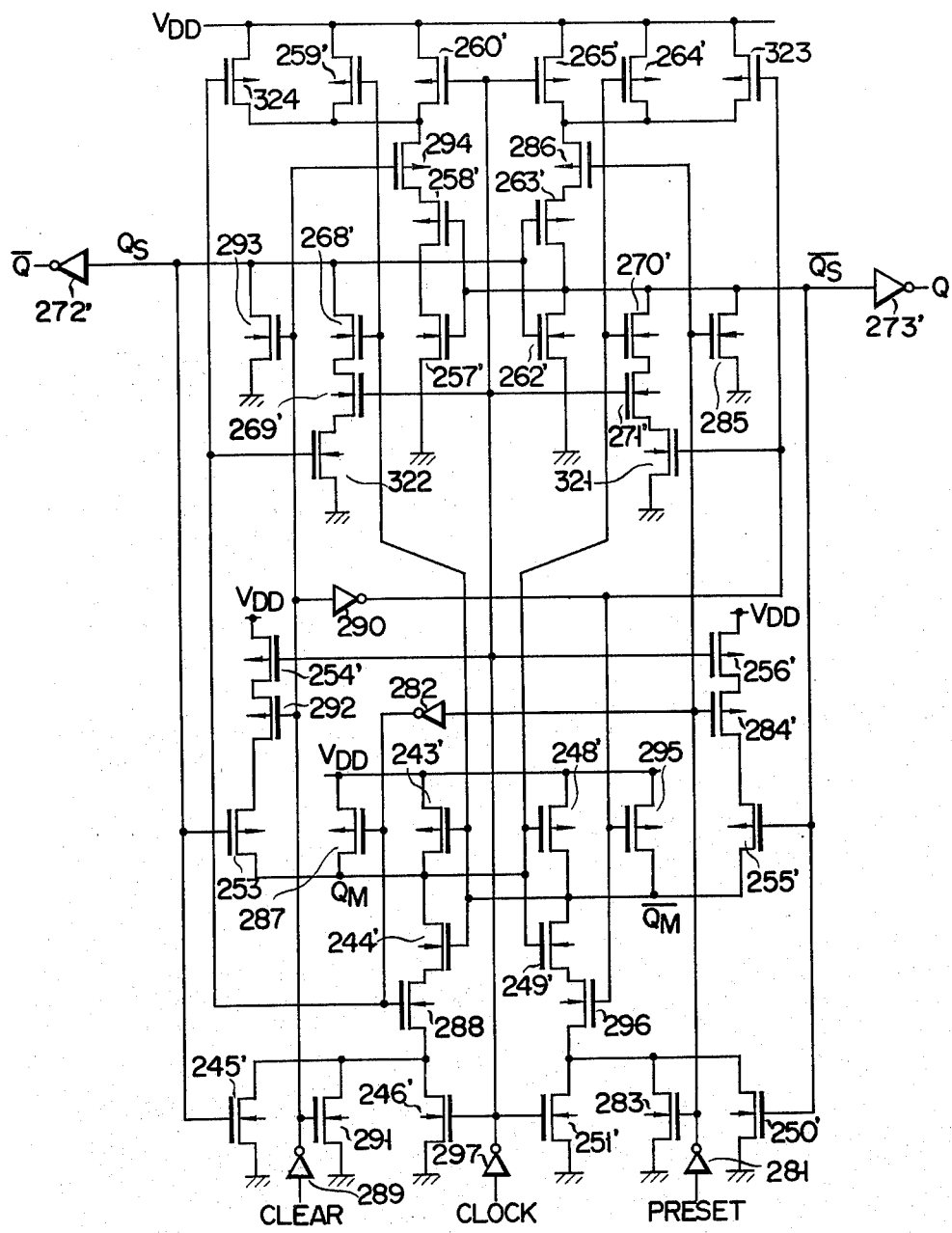
FIG. 10 shows a circuit diagram of the flip-flop circuit according to the invention which is the circuit of FIG. 9 with an additional transistor.

FIG. 10 shows another embodiment of the invention which corresponds to the circuit shown in FIG. 9 with additional transistors 321 to 324 to shorten the response time when the preset and clear are activated in the circuit. When the preset terminal of the circuit is activated, Preset=0 and accordingly the transistor 285 is turned on and Q=1, so that the three stages of the inverter 281, the transistor 285 and the inverter 273' determine the output Q. With respect to $\overline{Q}$, Preset=0 and hence the output of the inverter 282 is "0" to turn on the transistor 324. Also, since Clear="1", the transistor 294 is turned on. Since Q=1, as previously stated, the transistor 258' also is turned on, so that Qs=1 to determine $\overline{Q}$=0. The number of stages required in this time are the inverters 281 and 282, the transistor 324 and the inverter 272'. This is true for the clear activation.

Figure 11:
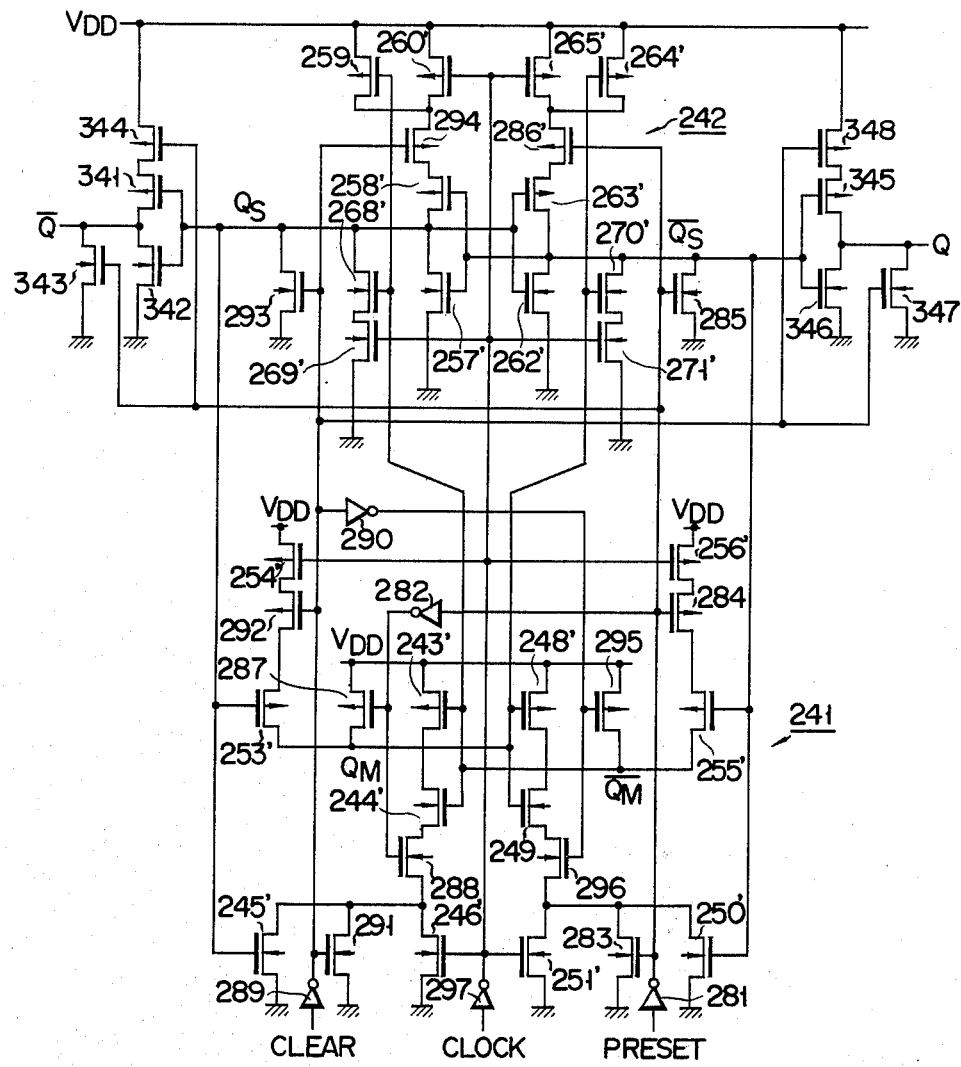
FIG. 11 shows a circuit diagram of another embodiment of the flip-flop circuit according to the invention which is the circuit of FIG. 9 provided at the output portion with an inverting gate.

In the embodiment shown in FIG. 11, the circuit shown in FIG. 9 is provided at the output portion with an inverting gate including transistors 341 to 344 and an inverting gate including transistors 345 to 348, in which the transistors 343 and 344 are controlled by a Preset line and the transistors 347 and 348 are controlled by a Clear line. This embodiment can shorten the Preset/clear response time to three stages.

The above-mentioned embodiments may be operated at a high speed, with low power consumption, and assembled at high density of integration. This embodiment is free from racing. As a consequence, according to the invention, it is possible to provide a binary flip-flop circuit adapted for a CMOS integrated circuit.

The embodiments of the invention thus far described are all examples of the invention as applied to a binary flip-flop circuit. Some embodiments of the invention when the flip-flop circuit according to the invention is applied for the J-K flip-flop will be described.

Figure 1:
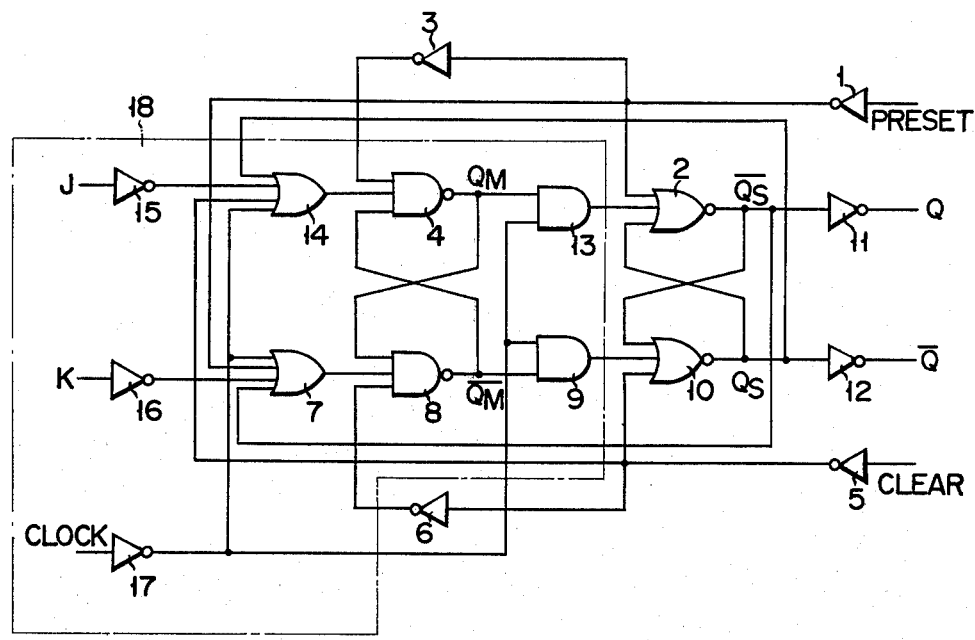
FIG. 1 shows a circuit diagram of a J-K flip-flop circuit as a prior art.
Figure 12:
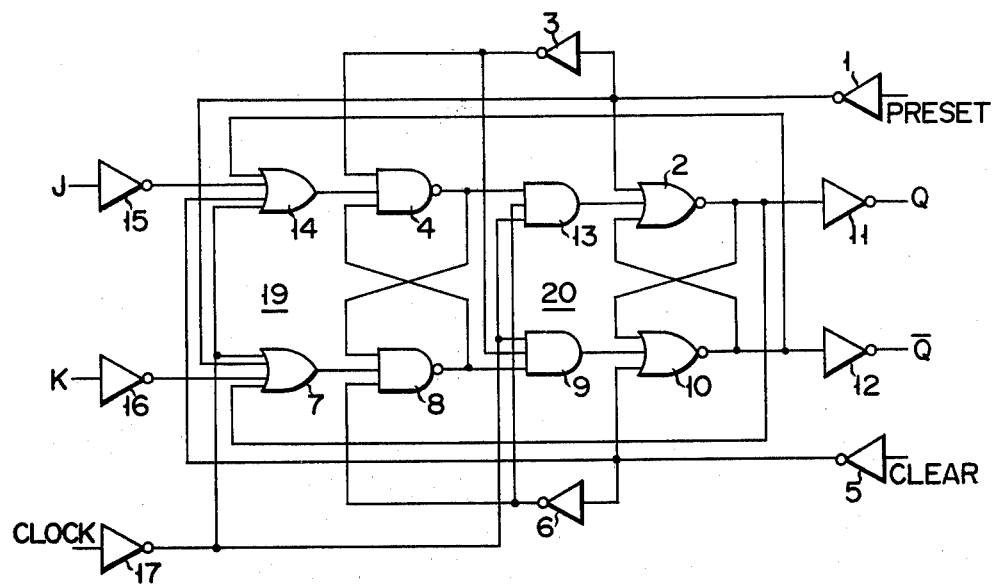
FIG. 12 shows a circuit diagram of the flip-flop circuit of the invention when it is applied for a J-K flip-flop.

The first example of the J-K flip-flop embodying the invention is illustrated in FIG. 12. The embodiment corresponds in structure to that in FIG. 1 and accordingly like reference symbols are used to designate like portions in FIG. 1. In the circuit shown in FIG. 12, the input J is connected through an inverter 15 to the first input terminal of an OR gate 14, while the input K is connected to the first input terminal of an OR gate 7, through an inverter 16. The clock input Clock is connected through an inverter 17 to the second input terminals of each OR gate 14 and 7. The preset input is connected through an inverter 1 to the third input terminal of the OR gate 7. The clear input is connected through an inverter 5 to the third input terminal of the OR gate 14. The output terminal of the OR gate 14 is connected to the first input terminal of NAND gate 4 and the output terminal of the OR gate 7 is applied to the first input terminal of the NAND gate 8. The output terminal of the NAND gate 4 is connected to the first input terminal of an AND gate 13 and to the second input terminal of the NAND gate 8. The output of the NAND gate 8 is connected to the third input terminal of the NAND gate 4 and one input terminal of an AND gate 9. The INVERTER 17 is connected at the output terminal to the other input terminal of each of AND gates 13 and 9. The INVERTER 5 is connected at the output terminal of each of NAND gate 8 and AND gate 13 via an INVERTER 6. The output terminal of the INVERTER 5 is directly connected to the third input terminal of the OR gate 14. The output of an INVERTER 1 is directly connected to the first input terminal of NOR gate 2 and to the fourth input terminal of OR gate 7, and through an INVERTER 3 to the input terminal of each of NAND gate 4 and AND gate 9. The output terminal of the AND gate 13 is connected to the second input terminal of the NOR gate 2 and the output terminal of the AND gate 9 is connected to the second input terminal of the NOR gate 10. The first input terminal of the NOR gate 2 is connected to the output terminal of the INVERTER 1 and the third input terminal of the NOR gate 2 is connected to the output terminal of the NOR gate 10. The output terminal of the NOR gate 2 is connected to the input terminal of the OR gate 7 and through an INVERTER 11 to the output terminal of the output Q. The output terminal of the NOR gate 10 is connected to one input terminal of the input terminal of the OR gate 14 and through an INVERTER 12 to the output terminal of the output $\overline{Q}$.

In the circuit in FIG. 12, the NAND gates 4 and 8, and the OR gates 7 and 14 form a master flip-flop 19. The NOR gates 2 and 10 and the AND gates 9 nad 13 form a slave flip-flop 20.

In operation, when the J-K flip-flop shown in FIG. 12 is preset, Preset=0 and Clear=1. Accordingly, the INVERTER 1 is "1" at the output and thus the NOR gate 2 is "0" at the output and accordingly, the INVERTER 11 is "1" at the output Q. Since the output of the INVERTER 3 is "0", the output of the AND gate 9 is "0". As described above, the output of the NOR gate 2 is "0" and the output of the INVERTER 5 is "0, so that the output of the NOR gate 10 is "1" and thus output $\overline{Q}$ of the INVERTER 12 is "0".

In this way, only the three stages of the INVERTER 1, the NOR gate 2, and the INVERTER 11 are necessary for the period from the time that the J-K flip-flop is preset until "1" is established in the output Q. Further, only the four stages of the INVERTERs 1 and 3, the NOR gate 10, and the INVERTER 12 are necessary for establishing "0" in the output $\overline{Q}$. As described above, the number of the gates necessary for a period from the preset of the flip-flop to the establishment of the outputs Q and $\overline{Q}$ is smaller than that of the circuit shown in FIG. 1. Further, the difference between the numbers of the gates of the outputs Q and $\overline{Q}$ is only one stage. Therefore, if the switching speed of the individual transistors forming the circuit shown in FIG. 12 is increased, the response time can be shortened significantly. The short response time indicates that the superfluous current produced when the outputs Q and $\overline{Q}$ are on a level may be reduced. This brings about a low power consumption. The upper and the lower circuit constructions of the circuit in FIG. 12 are symmetrical with each other, the operation of the preset may be correspondingly applied to the operation of the clear input.

Figure 13A:
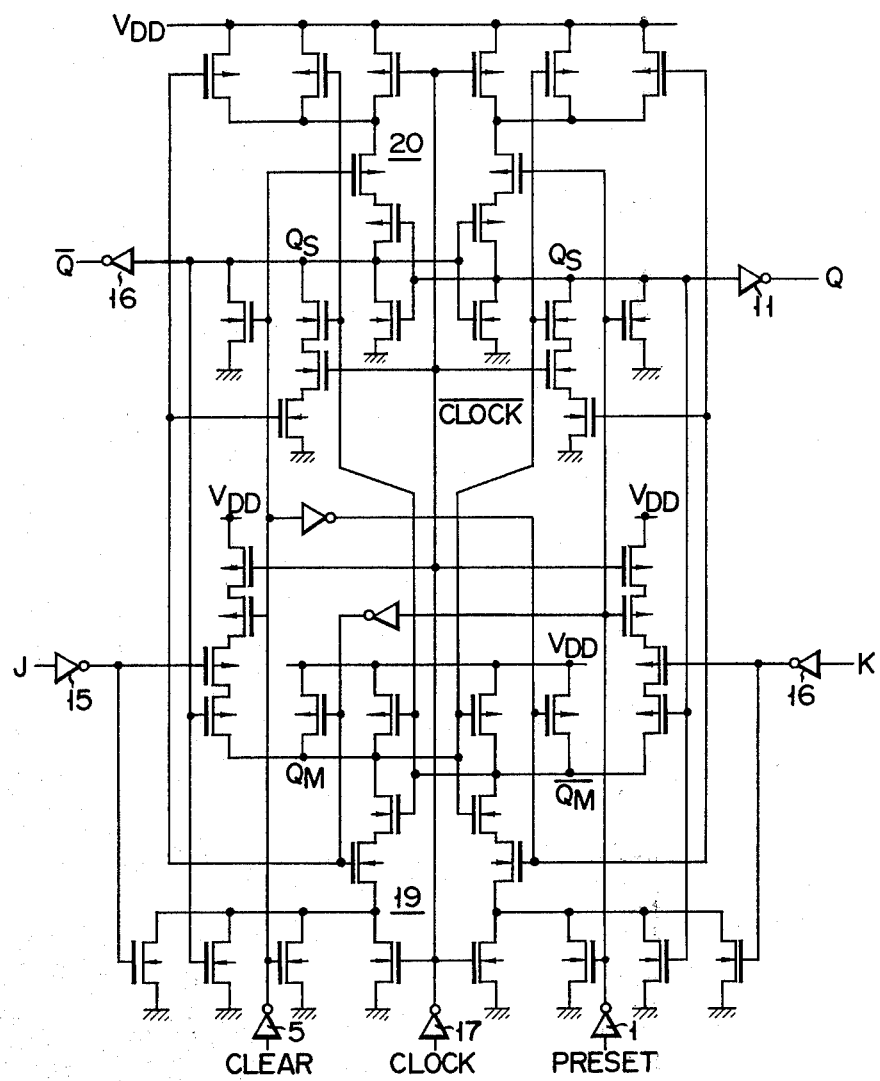
FIG. 13(a) shows a circuit diagram of a CMOS circuit used in the circuit in FIG. 12.
Figure 13B:
FIG. 13(b) shows a set of waveforms useful in explaining the operation of the CMOS circuit shown in FIG. 13(a)

The operation of the J-K flip-flop shown in FIG. 12 may be tabulated as below. FIG. 13(a) shows a circuit diagram of the flip-flop circuit shown in FIG. 12 when it is constructed by using the complementary MOS circuit. FIG. 13(b) shows wave forms diagrammatically illustrating the operation of the circuit in FIG. 13(a).

Figure 14:
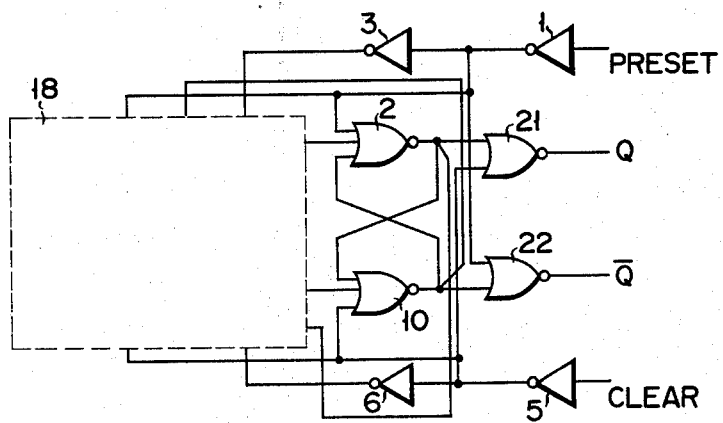
FIG. 14 shows a circuit diagram of a modification of the circuit shown in FIG. 12.

Turning now to FIG. 14, there is shown another embodiment of the invention as the J-K flip-flop. As described above, the embodiment of FIG. 12 applies the preset and the clear to the slave flip-flop 20. Specifically, the output of the INVERTER 6 is supplied to the AND gate 13.

| Preset | Clear | Clock | J | K | $Q_{n+1}$ | $\overline{Q_{n+1}}$ |
|--------|-------|-------|---|---|-----------|----------------------|
| 0 | 1 | NONE | NONE | NONE | 1 | 0 |
| 1 | 0 | NONE | NONE | NONE | 0 | 1 |
| 0 | 0 | NONE | NONE | NONE | INDEFINITE | INDEFINITE |
| 1 | 1 | 1→0 | 0 | 0 | $Q_n$ | $\overline{Q_n}$ |
| 1 | 1 | 1→0 | 1 | 0 | 1 | 0 |
| 1 | 1 | 1→0 | 0 | 1 | 0 | 1 |
| 1 | 1 | 1→0 | 1 | 1 | $\overline{Q_n}$ | $Q_n$ |
| 1 | 1 | 1 | NONE | NONE | $Q_n$ | $\overline{Q_n}$ |

In this embodiment, however, the preset and clear signals are applied to an output logic circuit provided at the output stage of the slave flip-flop 20. Reference numerals 21 and 22 designate NOR gates which are used in place of the INVERTERs 11 and 12 shown in FIG. 12. One input terminal of the NOR gate 21 is connected to the output terminal of a NOR gate 2 and the other input terminal of the NOR gate 21 is connected to the output terminal of an INVERTER 5. The NOR gate 22 is connected at one input terminal to the output terminal of a NOR gate 10 and at the other input terminal to the output terminal of an INVERTER 1. In FIG. 14, the circuit 18 corresponds to the circuit 18 shown in FIG. 1. The output terminal of the INVERTER 1 in FIG. 14 is connected to the input terminal of the OR gate 7 shown in FIG. 1. Similarly, the output terminal of the NOR gate 10 is connected to the input terminal of the OR gate 14; the output terminal of the INVERTER 3 is connected to the input terminal of the NAND gate 4; the input terminal of the NOR gate 2 is connected to the output terminal of the AND gate 13; the input terminal of the NOR gate 10 is connected to the output terminal of the AND gate 9; the output terminal of the NOR gate 2 is connected to the input terminal of the OR gate 7; the output terminal of the INVERTER 6 is connected to the input terminal of the NAND gate 8; and the output terminal of the inverter 5 is connected to the input terminal of the OR gate 14.

Figure 15:
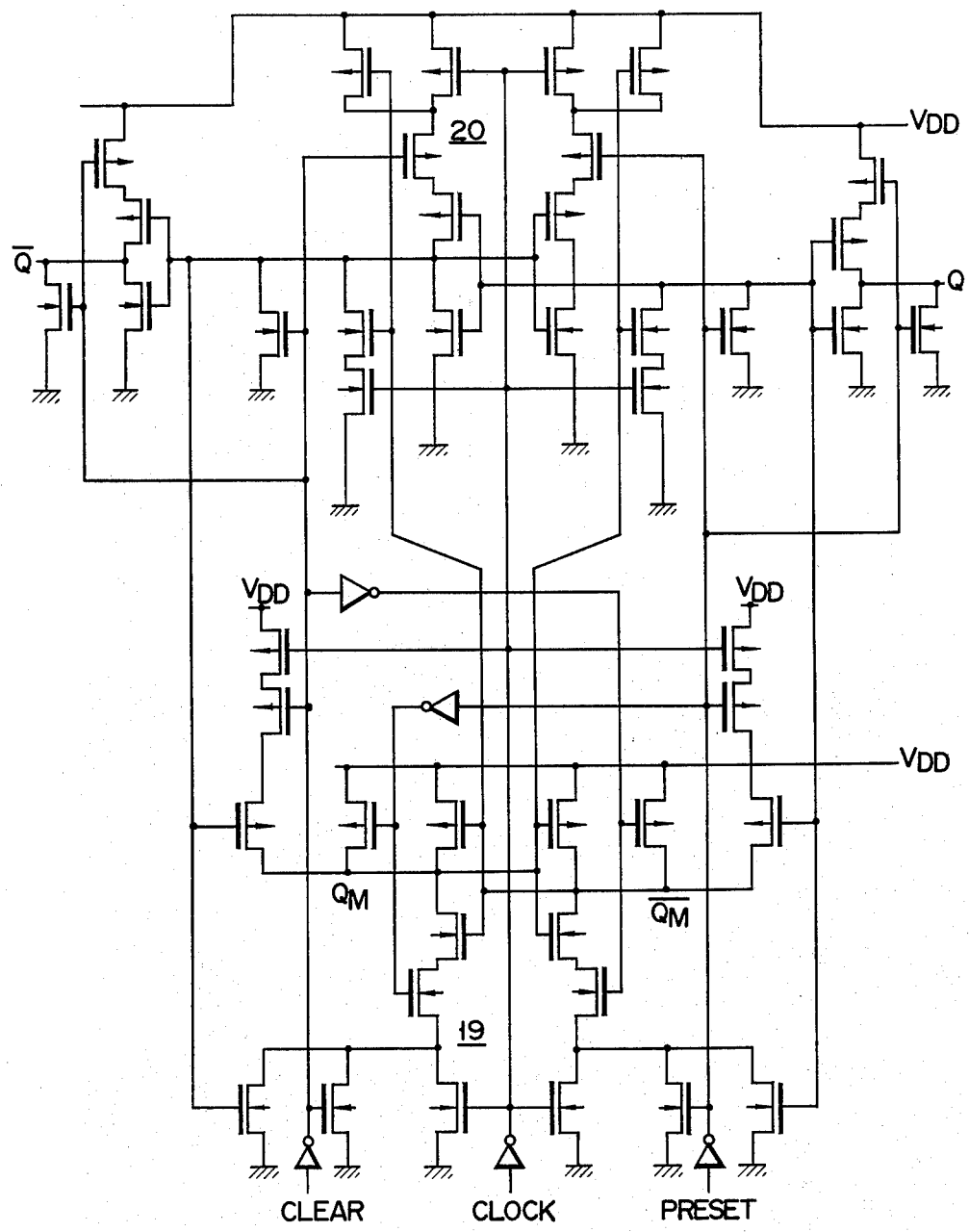
FIG. 15 shows an example of the CMOS circuit used in the FIG. 14 circuit.

In the circuit shown in FIG. 14, when the preset signal is applied thereto, the given level of the output $\overline{Q}$ is established by the three stages of the INVERTER 1, the NOR gate 2, and the NOR gate 21. The given level of the output Q is established through the INVERTER 1 and the NOR gate 22, that is, in two stages. Further, the stage difference between both the outputs is only one stage. The same thing is true for the clear operation. FIG. 15 shows a circuit diagram when the circuit shown in FIG. 14 is constructed by using the CMOS circuit.

Figure 16:
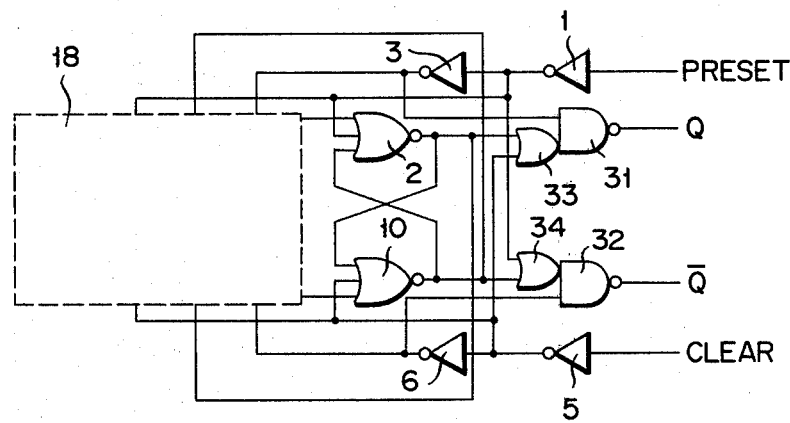
FIG. 16 shows a circuit diagram of an application of the FIG. 14 circuit.

FIG. 16 shows an application of the circuit in FIG. 14. In this embodiment, the output portion includes a gate circuit to apply the preset and the clear to the flip-flop circuit. The gate circuit includes NAND gates 31 and 32 and OR gates 33 and 34 included in the NAND gates 31 and 32. The given level of the output $\overline{Q}$ is established through three stages of INVERTERs 1 and 3 and the NAND gate 31. The given level of the output Q is established through two stages of the INVERTER 1 and the NAND gate 32. The stage dfference is only one stage. The same thing is true for the clear operation. FIG. 17 shows a circuit diagram when the circuit shown in FIG. 16 is realized by using the CMOS circuit.

Figure 18:
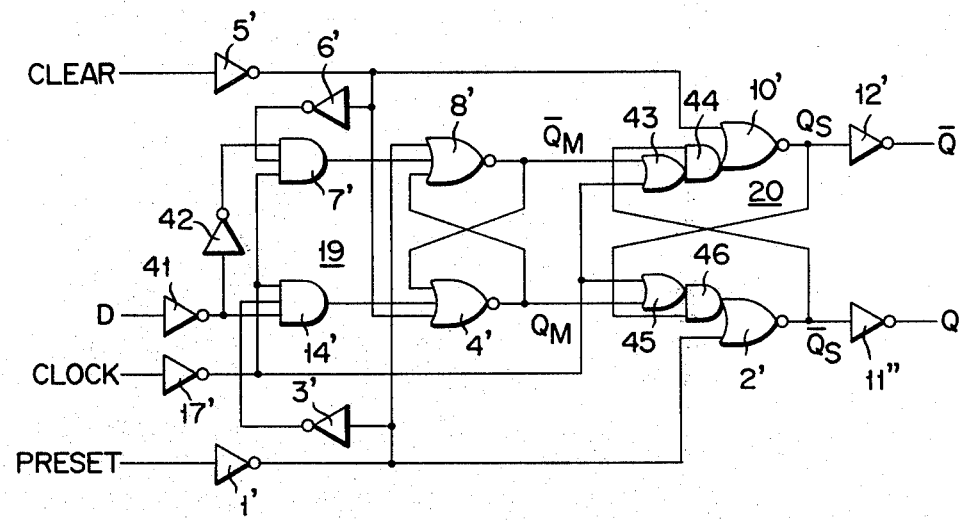
FIG. 18 shows a circuit diagram when the flip-flop circuit of the invention is applied to a D-type flip-flop.

FIG. 18 shows an example in which the invention is applied to a D-type flip-flop. In FIG. 18, like symbols with primes are used to designate the corresponding portions in the above-mentioned embodiments. The input D supply terminal is connected through an inverter 41 to one input terminal of an AND gate 14'. The output terminal of the inverter 41 is connected through an inverter 42 to one input terminal of an AND gate 7'. The output terminal of an inverter 17' is connected to one input terminal of each OR gate 43 and 45. The output terminals of NOR gates 8' and 4' are connected to the other input terminals of the OR gates 43 and 45, respectively. The output terminals of the OR gates 43 and 45 are connected to one input terminals of AND gates 44 and 46, respectively. The output terminals of NOR gates 2' and 10' are connected to the other input terminals of the AND gates 44 and 46, respectively. The output terminals of the AND gates 44 and 46 are connected to one input terminals of the NOR gates 10' and 2', respectively.

Figure 19A:
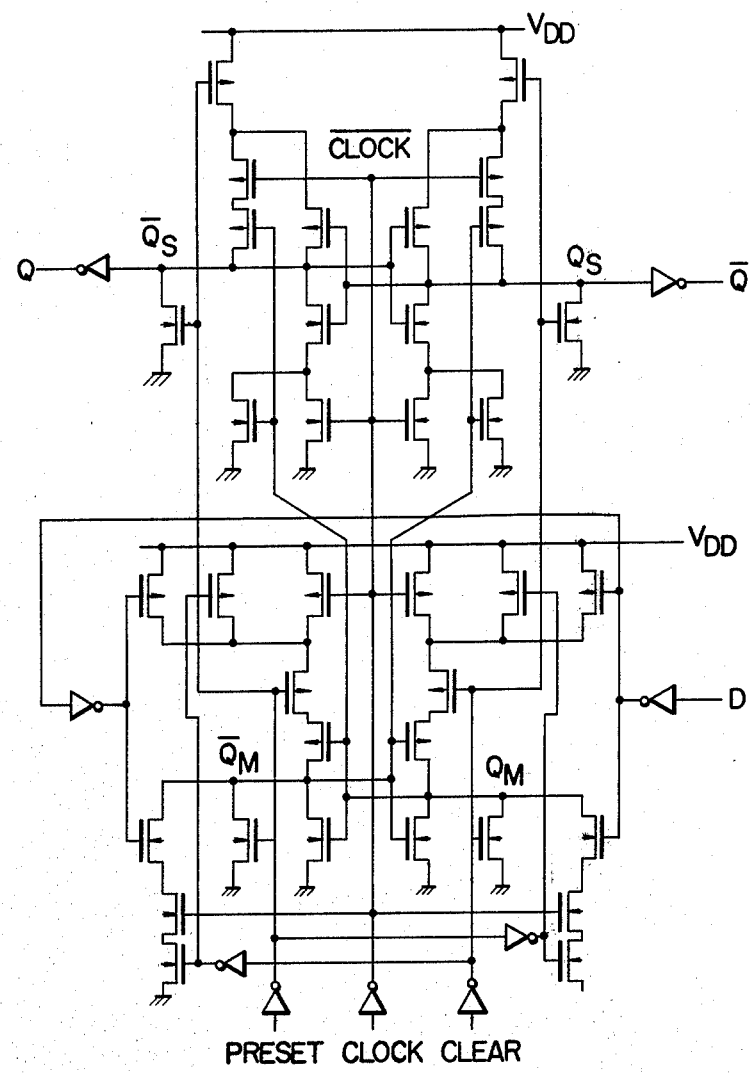
FIG. 19 shows another example of the CMOS circuit used in the circuit shown in FIG. 18.
Figure 19B:
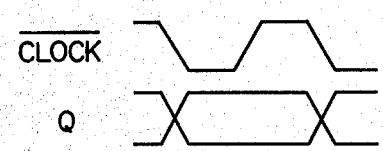

When the preset signal is applied to the circuit shown in FIG. 18, the level of the output Q is established through the three stages of the inverter 1', the NOR gate 2' and the inverter 11'. The level of the output $\overline{Q}$ is established through the four stages of the inverter 1', the NOR gate 2', the NOR gate 10' and the inverter 12'. The stage difference between both the outputs is only one stage. This is true for the clear operation. FIG. 19 shows a circuit diagram when the circuit in FIG. 18 is realized by the CMOS circuit. The operation of the D-type flip-flop in this embodiment is tabulated below.

| Preset | Clear | Clock | D | $Q_{n+1}$ | $\overline{Q_{n+1}}$ |
| --- | --- | --- | --- | --- | --- |
| 0 | 1 | NONE | NONE | 1 | 0 |
| 1 | 0 | NONE | NONE | 0 | 1 |
| 0 | 0 | NONE | NONE | INDEF-INITE | INDEF-INITE |
| 1 | 1 | 0 → 1 | 0 | 0 | 1 |
| 1 | 1 | 0 → 1 | 1 | 1 | 0 |

Figure 20:
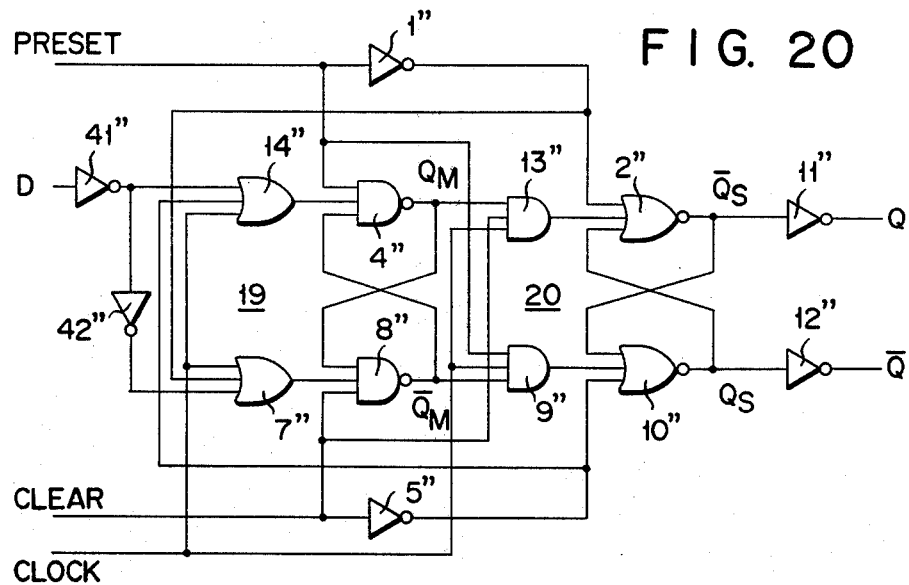
FIG. 20 shows a circuit diagram of an application of the FIG. 18 circuit.

FIG. 20 shows a circuit diagram of an application of the circuit shown in FIG. 18. In FIG. 20, like symbols often with double primes designate the corresponding portions in FIG. 18. When the preset signal is applied to this circuit, the output level at the output Q is set up through the three stages of an inverter 1", a NOR gate 2" and an inverter 11". The level of the output $\overline{Q}$ is set up by the four stages of the inverter 1", the NOR gate, "NOR" gate 10" and an inverter 12".

The above-mentioned embodiments serve as binary flip-flops if "1" is applied to both the J and K inputs. Further, those are applicable for other types of MOS circuit such as mono channel MOS, in addition to the CMOS circuit. The above-mentioned embodiments are so designed as to activate both the preset and the clear terminals; however, either the preset terminal or the clear terminal alone may be activated.

As described above, according to the embodiment, the response time from an instant that the preset terminal or the clear terminal is activated until the corresponding level at the corresponding output is set up, is reduced and the difference between them is also reduced. The flip-flop circuit obtained is operable at high speed but with low power consumption.

Some embodiment of the invention when the invention is applied for a ring type counter will be described referring to the drawings.

An embodiment shown in FIG. 21 is such an example that the binary flip-flop of which the output data changes at the trailing edge of a clock signal (timing pulse) as referred to relating to FIG. 4 is applied within a ring counter. The construction of the binary flip-flop $40_1$ in FIG. 21 is roughly categorized into a master flip-flop 41 and a slave flip-flop 42. The circuit construction of each circuit 41 and 42 is the same as that of the corresponding ones in FIG. 4. Accordingly, the explanation of it will be omitted here.

The binary flip-flop $40_2$ in FIG. 21 is comprised of a master flip-flop 41' and a slave flip-flop 42'. These flip-flops 41' and 42' have the same constructions as those of the flip-flops 41 and 42, respectively. Therefore, like symbols with primes are used for designating the corresponding portions. The connection between those flip-flops is so arranged as to share commonly the clock signal Clock. The output terminal $Q_{s1}$ is connected to the gates of transistors 45' and 53' while the output $\overline{Q_{s1}}$ is connected to the gates of the transistors 50' and 55'. Similarly, the output terminal $\overline{Q_{s2}}$ is connected to the gates of transistors 50 and 55 while the output terminal QS2 is connected to the gates of the transistors 45 and 53.

Figure 22:
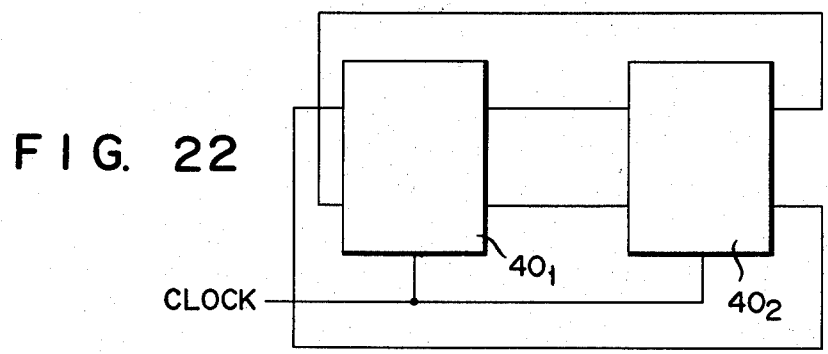
FIG. 22 shows a block diagram of the circuit shown in FIG. 21.

FIG. 22 expresses the circuit shown in FIG. 21 in the form of block diagram. As seen, the FIG. 1 circuit has a construction that the output data of the prestage of the flip-flop $40_1$ is applied as the input data to the poststage of the flip-flop $40_2$ in a cascade fashion and the output of the poststage is fed back to the prestage. That is to say, the circuit of FIG. 21 forms a ring counter. Further, the counter serves as a scale of 4 counter of the shift register type by commonly applying the clock signal to the clock inputs of both the flip-flops.

In operation, let it be assumed that the initial state of the circuit is: $\overline{Q_{s2}}=1$, $Q_{s2}=0$, $\overline{Q_{s1}}=0$ $Q_{s1}=1$, and Clock=1. With respect to the binary flip-flop $40_1$, $Q_{s2}=1$ and the transistor is turned on (conductive); $Q_{s2}=0$ and the transistor 55 is turned off (non-conductive) while the transistor 50 is turned on. Clock=1 and the transistor 54 is turned on, so that $\overline{Q_{M1}}=0$ and $Q_{M1}=1$ and accordingly, the transistor 70 is ON while the transistor 68 is OFF. With respect to the binary flip-flop $40_2$, $\overline{Q_{s1}}=1$ and the transistor 50' is OFF while the transistor 55' is ON. $Q_{s1}=0$ and the transistor 45' is ON while the transistor 53' is OFF. Clock=1 and the transistor 56' is ON. Accordingly, through the transistors 56' and 55', $Q_{M2}=0$ and the transistor 44' is ON. Since the transistor 45' is ON because of $Q_{s1}=0$, $\overline{Q_{M2}}=1$. Accordingly, the transistor 68' is ON while the transistor 70' is OFF.

Let us consider a state of the flip-flop $40_1$ when Clock=0. Clock=0 and the transistor 71 is ON and $\overline{Q_{M1}}=0$ and the transistor 70 is ON. Qs1 changes from "0" to "1". The $Q_{s1}=1$ and the transistor 58 is ON. $Q_{M1}=1$ and the transistor 59 is ON. Accordingly, $\overline{Q_{s1}}$ changes from "1" to "0". With respect to the flip-flop $40_2$, during Clock=0, the transistors 46' and 69' maintain the ON states, so that $\overline{Q_{M2}}=1$ and $\overline{Q_{s2}}=1$ and hence $Q_{M2}=0$ and $Q_{s2}=0$ are held.

When Clock=1, the flip-flop $40_1$ has a state such that $\overline{Q_{s2}}=1$ is still held, and $\overline{Q_{M1}}=0$ and $Q_{M1}=1$ are also held as they stand $Q_{s1}=1$ and $\overline{Q_{s1}}=0$ are unchanged. With respect to the flip-flop $40_2$, Clock=1 and the transistor 54' is turned on. $Q_{s1}=1$ and the transistor 53' is ON. Accordingly, $\overline{Q_{M2}}$ changes from "1" to "0", and $Q_{M2}$ changes from "0" to "1". However, since the transistor 65' is turned on, $Q_{s2}=0$ and $\overline{Q_{s2}}=1$ still remain unchanged.

When Clock=0, in the flip-flop $40_1$, since the transistors 46, 51, 69 and 71 are ON, $Q_{M1}=0$ and $\overline{Q_{M1}}=1$ are held in the states. Accordingly, $Q_{s1}=1$ and $\overline{Q_{s1}}=0$ are also unchanged. The flip-flop $40_2$ holds $\overline{Q_{M2}}=0$ and $Q_{M2}=1$ since the transistors 46' and 51" are ON because of Clock=0. However, $\overline{Q_{M2}}=0$ and the transistor 70' is ON, and Clock=0 and the transistor 71' is ON, so that $Q_{s2}$ changes from "0" to "1". Therefore, the transistor 58' is turned on, and transistor 59' is ON because of $Q_{M2}=1$, so that $\overline{Q_{s2}}$ changes from "1" to "0".

When Clock=1, in the flip-flop $40_1$ $Q_{s2}=0$ and thus the transistor 53 is OFF, and $\overline{Q_{s2}}=1$ and the transistor 55 is turned on. Clock=1 and accordingly the transistor 56 is turned on. As a result, $Q_{M1}$ changes from "1" to "0". Since $Q_{M1}$ becomes '0', the transistor 44 is turned on. $\overline{Q_{s2}}$="0" and the transistor 45 is ON. As a result, $\overline{Q_{M1}}$ changes from "0" to "1". Since Clock=1, the transistor 60 is ON, so that the flip-flop $40_1$ holds $Q_{s1}=1$ and $\overline{Q_{s1}}=0$. In the flip-flop $40_2$, since $Q_{s1}$ and $Q_{s2}$ are not changed, $Q_{M2}$ and $\overline{Q_{M2}}$ do not change and $Q_{s2}$ and $\overline{Q_{s2}}$ also do not change.

When Clock=0, in the flip-flop $40_1$, since $Q_{s2}$ and $\overline{Q_{s2}}$ are not changed, $\overline{Q_{M1}}=1$ and $Q_{M1}=0$ are unchanged. Accordingly, $Q_{M1}=0$ and thus the transistor 68 is ON, and Clock=0 and the transistor 69 is turned on, so that $\overline{Q_{s1}}$ changes from "0" to "1", and thus the transistor 63 is turned on. Further, $\overline{Q_{M1}}=1$ and thus the transistor 64 is ON, so that $Q_{s1}$ changes from "1" to "0". In the flip-flop $40_2$, since Clock=0, the transistors 54' and 56' are OFF while the transistors 46' and 51' are ON. Accordingly, the flip-flop $40_2$ holds $Q_{M2}=1$ and $\overline{Q_{M2}}=0$. Further, clock=0 and the transistors 69' and 71' are turned on, and $Q_{M2}=0$ and the transistor 70' is turned on, so that the flip-flop $40_2$ holds $Q_{s2}=1$ and $\overline{Q_{s2}}=0$.

Figure 23:
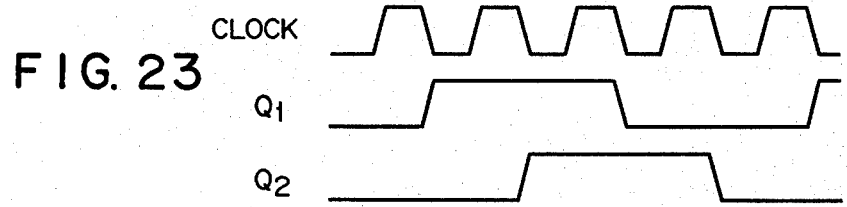
FIG. 23 shows set of waveforms for illustrating the operation of the circuit in FIG. 21.

The operation as mentioned above is repeated. In the operation, the outputs $Q_1$ and $Q_2$ of the flip-flop have four states: "0, 0", "1, 0", "1, 1" and "0, 1". Accordingly, the operation waveforms as shown in FIG. 23 are obtained. In the operation, data circulates through a route of the master section 41 and the slave section 42 in the flip-flop $40_1$ and the master section 41' and the slave section 42' of the flip-flop $40_2$. The data circulation is made every four periods of the clock. Accordingly, the circuit operates as a scale of 4 counter.

As described above, the circuits in FIGS. 2 and 21 both operate as the binary flip-flop. Let us consider both the circuits in more detail, however. The circuit shown in FIG. 21 does not use the anticlock signal with respect to the clock signal Clock, and therefore does not require the inverter 231 to have large transistors as shown in FIG. 2. Accordingly, this circuit is advantageous in the light of the power consumption and the density of integration, so that it is useful when it is used in the system operating at high speed, that is, using a clock signal with a high frequency. With respect to the response time of each the output $\overline{Q_{s1}}$, where $\overline{Q_{s1}}$ changes from "0" to "1", the Clock is "0" the transistor 69 merely is equal to turned on. Therefore, the response time is one stage of a transistor. At this time, the response time of the output $Q_{s1}$ corresponds to two stages of transistors for the following reason. $\overline{Q_{s1}}$ is "1" and the transistor 63 is turned on and changes from "1" to "0".

When the output $\overline{Q_{s1}}$ changes from "1" to "0", the operation is completely symmetrical with that mentioned above. However, the response time is equal to two stages of transistors. Therefore, the response time in this circuit is shorter than that of the circuit shown in FIG. 2 by an amount equal to one stage. Further, a race situation never occurs since the circuit of this embodiment does not use the antiphase clock which causes the racing problem in the circuit in FIG. 2.

Figure 24A:
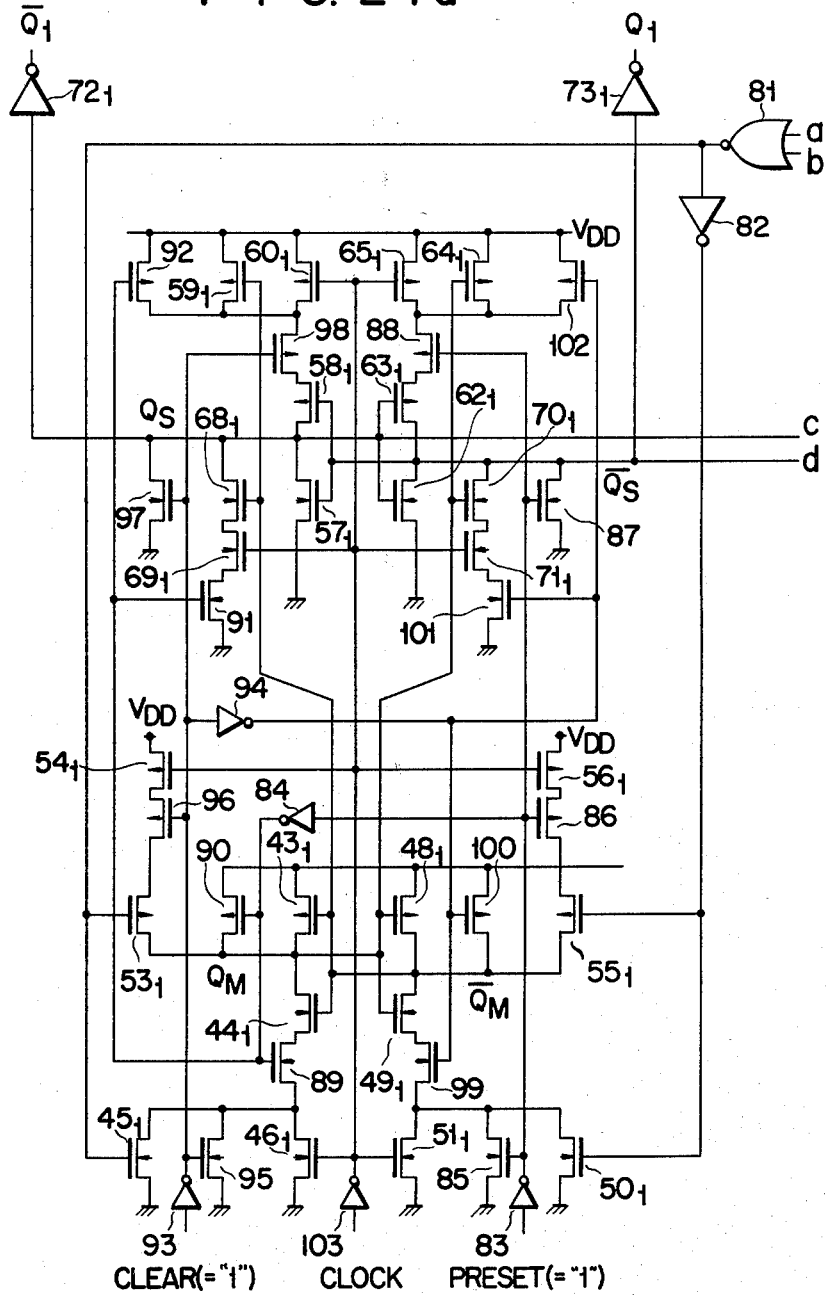
FIGS. 24(a) to 24(c) show circuit diagrams when scale of 5 counters are constructed by using the flip-flop circuits according to the invention.
Figure 24B:
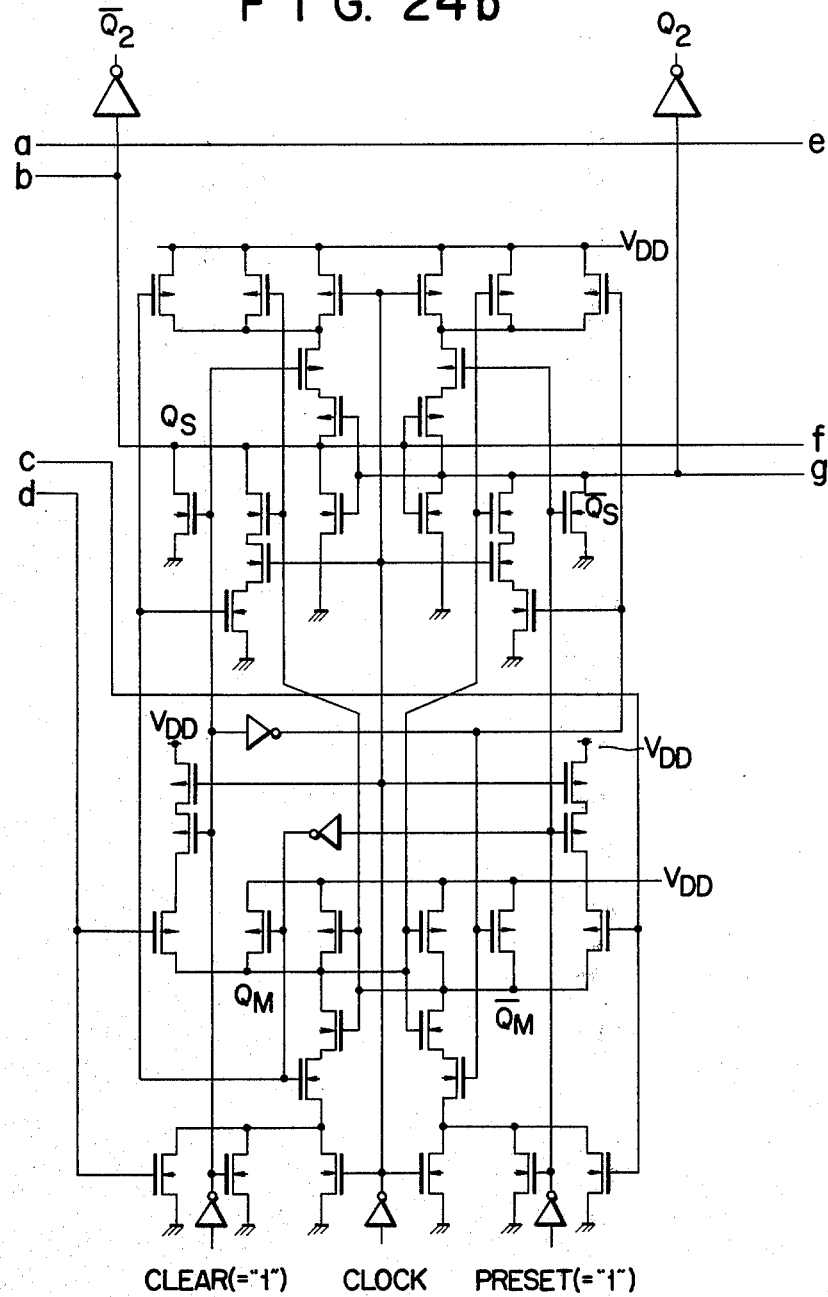
Figure 24C:
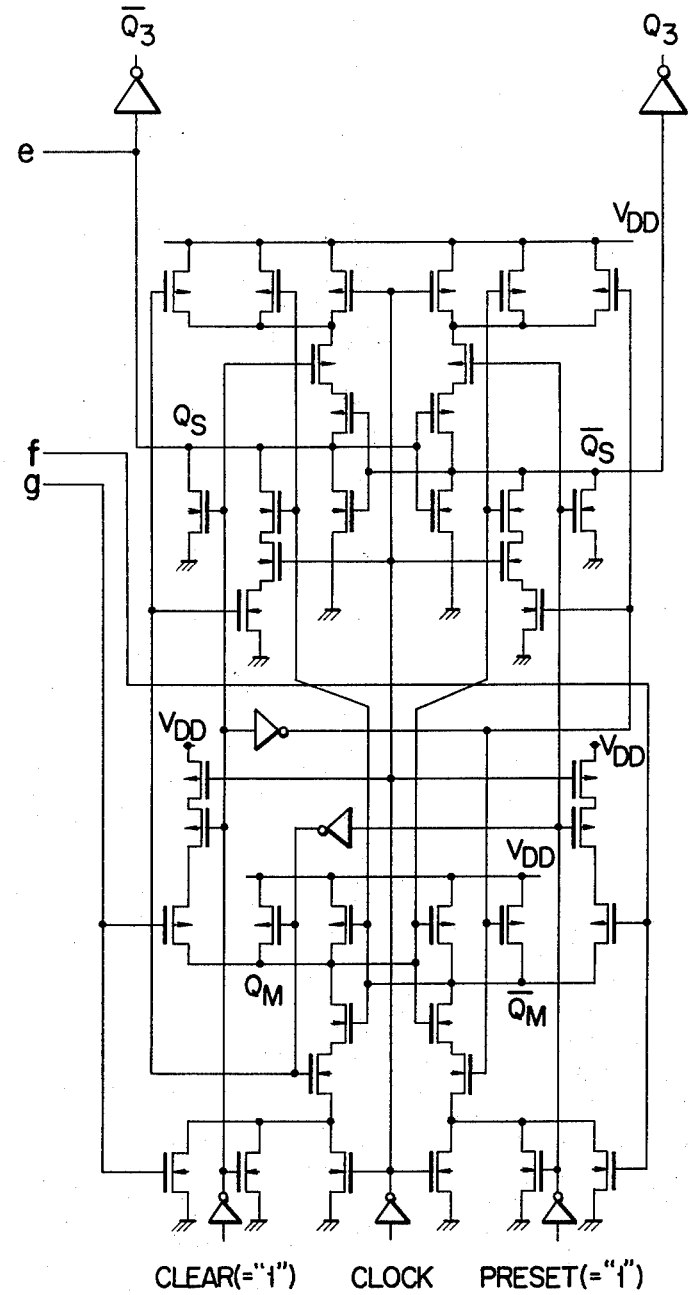
Figure 25:
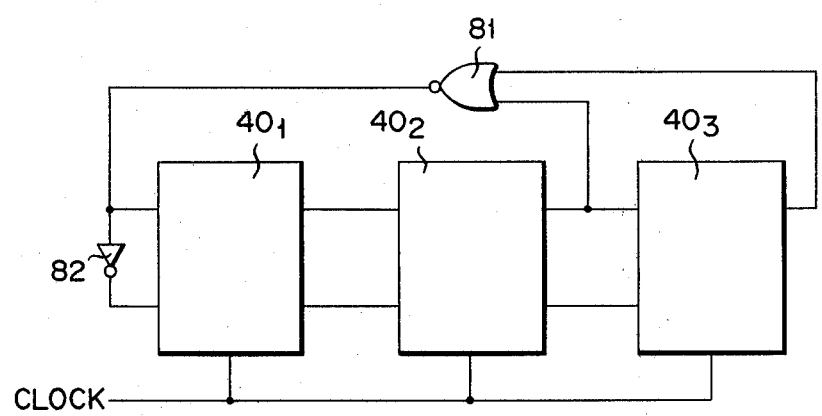
FIG. 25 shows a block diagram of the circuit shown in FIG. 24.

Accordingly, if the number of the stages of the flip-flop in the ring counter is changed, an even scale counter is formed. To form an odd scale counter, the output signals from a proper output stage are logically processed to feed back data to the first stage as early as possible. A scale of 5 counter shown in FIGS. 24(a) to (c) are designed to the basis of such a concept. FIG. 25 expresses the circuit in FIGS. 24(a) to (c) in a block form. As seen from FIG. 25, the outputs of the flip-flops $40_2$ and $40_3$ of the flip-flops $40_1$ to $40_3$ are connected in a cascade fashion and are applied to NOR logic represented by the NOR gate 81 logically processed signals are fed back to the flip-flop $40_1$. In this way, the scale of 5 counter is formed.

Figure 26:
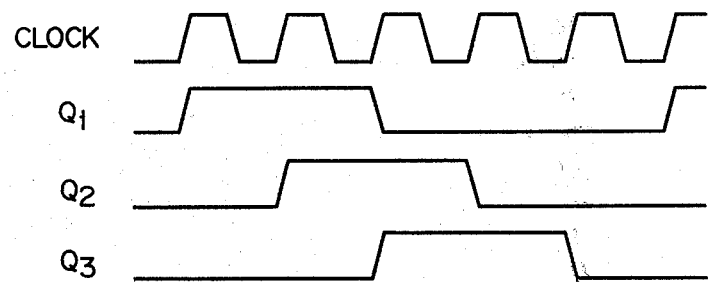
FIG. 26 shows a set of waveforms for illustrating the operation of the circuit shown in FIG. 24.

FIG. 26 shows a set of signal waveforms associated with FIG. 24. The waveforms show that the circuit returns to the initial state after five clocks of the clock signal Clock are produced. FIGS. 24(a) to (c) use overlappingly the same alphabets a to g. In those figures, the portions designated by the same alphabets are connected to each other. Since the counter shown in FIG. 24(a) to (c) is the scale of 5 counter with a preset/clear function, elements for effecting such a function are additionally used. To obtain the preset function, inverters 83 and 84 and transistors 85 to 92 are used to supply preset signal preset. Further, inverters 93 and 94 and transistors 95 to 102 are provided relating to supply supplying the clear signal. Additionally, an inverter 103 is used relating to the Clock. Here, when Preset = "1" and Clear = "1", neither preset nor clear is applied to the circuit. This embodiment employs the binary flip-flop of the leading edge synchronizing type in which the output data Q1 to Q3 change at the leading edge of the clock signal, unlike the previous embodiment of the trailing edge synchronizing type. Nevertheless, both the embodiments are common in principle and accordingly, like portions are designated by like symbols with suffix "1". The feature of the leading edge type flip-flop resides in that, since the data is changed at the leading edge of the Clock, the clock signal Clock is supplied to the N-channel transistors $69_1$ and $71_1$, for example.

Figure 27:
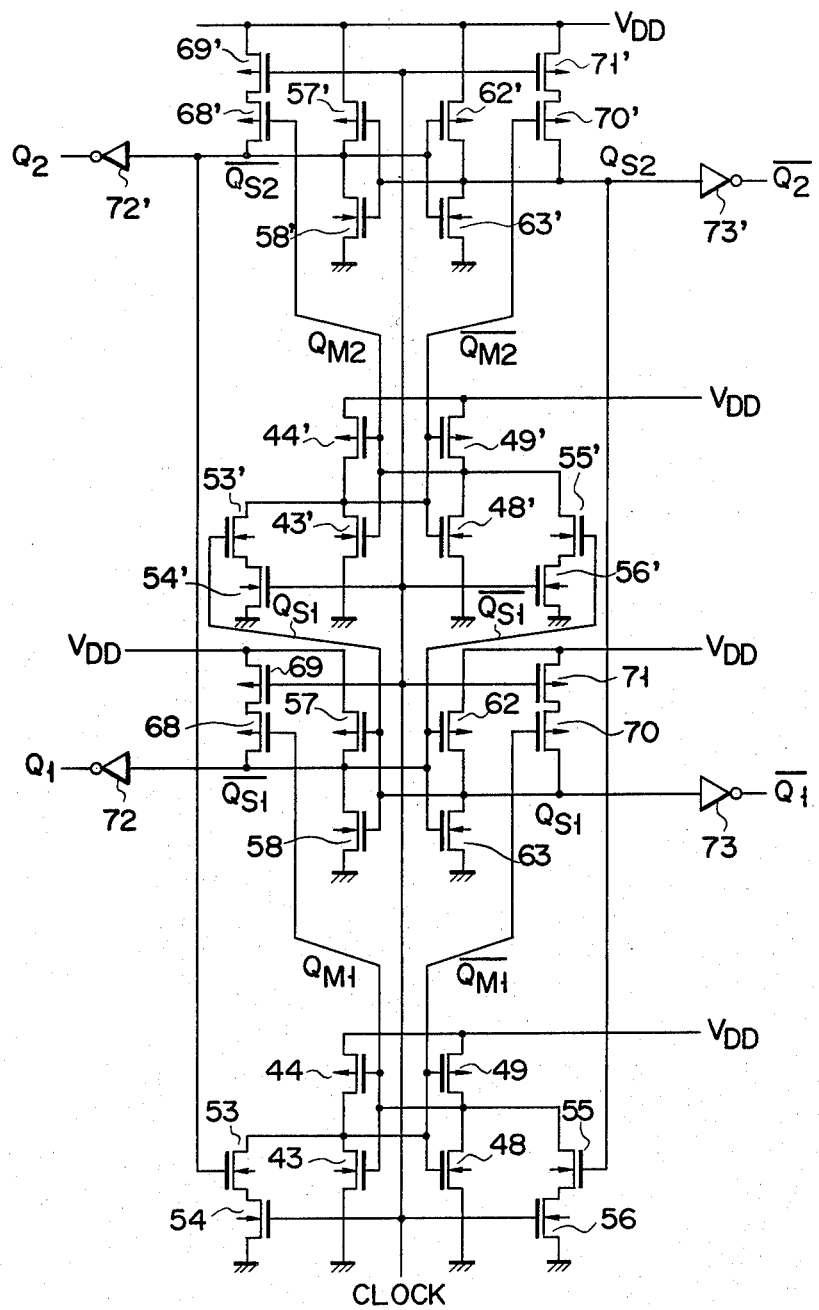
FIG. 27 shows a circuit diagram when the circuit shown in FIG. 21 is simplified.

FIG. 27 shows an embodiment of the invention when the circuit shown in FIG. 21 is simplified. Specifically, in this circuit, the transistors 45, 46, 50, 51, 59, 60, 64, 65, 45', 46', 50', 51', 59', 60', 64' and 65' of FIG. 21 are omitted. The circuit construction of this embodiment can attain the operation illustrated by the waveforms shown in FIG. 23. Like the circuit FIG. 27, the circuit shown in FIGS. 24(a) to (c) may be simplified.

It should be understood that the invention is not limited to the above-mentioned embodiment. For example, for forming the counter, other kinds of counters than the binary counter may also be used together with the binary counters, unlike the embodiment mentioned above using only the binary counters. In the case of FIG. 24, the output data at a proper stage is fed back to the first stage through the logical gate 81. In alternation, the reset, preset or clear signal is applied to the respective binary flip-flops through a route different from the data loop. In the specification, "to connect the binary flip-flops in a cascade fashion" means that the flip-flop at a stage is connected in series to that at the succeeding stage, and further that, in the case of FIG. 25 for example, the outputs of the flip-flop $40_1$ at the first stage and the flip-flop $40_2$ at the second stage are logically processed and are applied to the flip-flop $40_3$ at the third stage; in other words, logical gates are provided between adjacent flip-flops.

As described above, this embodiment employs the binary flip-flops which are operable at high speed and with low power consumption, and are free from a race problem.

An embodiment of the invention in which the invention is applied to a ripple counter will be described.

Figure 28:
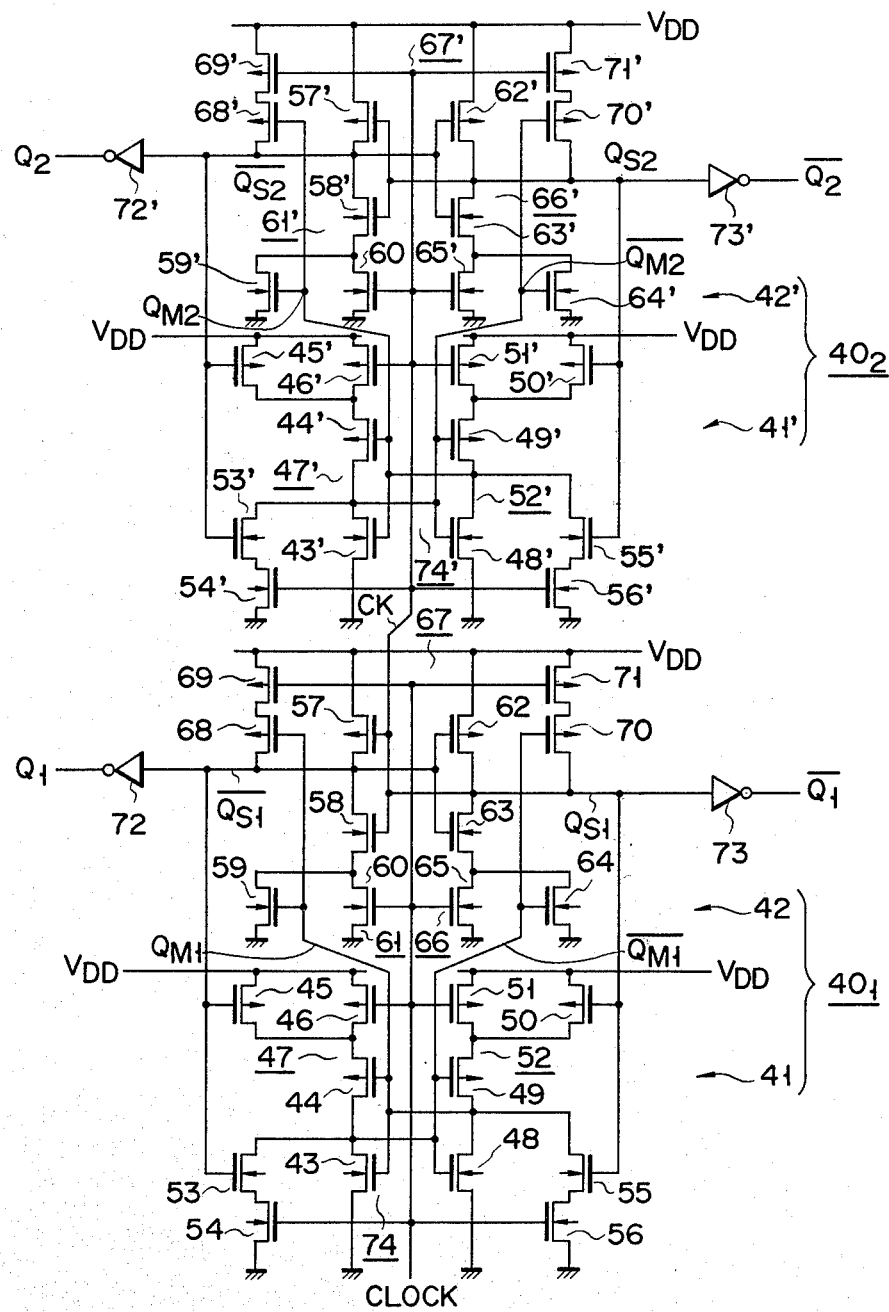
FIG. 28 shows a circuit diagram when the binary flip-flop shown in FIG. 4 is employed as a ripple counter.

An embodiment shown in FIG. 28 is a ripple counter using the binary flip-flops of the trailing edge synchronizing type in which the output data change occurs at the trailing edge of the clock signal (timing pulse), as described with regard to FIG. 4. The flip-flops $40_1$ and $40_2$ in FIG. 28 are the same as those described in the embodiments in FIGS. 4 and 21. Accordingly, like reference symbols are used to designate like portions in FIG. 21.

In FIG. 28 in the connection between the binary flip-flops $40_1$ and $40_2$, the output terminal Qs1 of the flip-flop $40_1$ is connected to the clock input terminal CK of the flip-flop $40_2$. Further, the output terminal $\overline{Q_{s1}}$ of the inverter 61 is connected to the gates of the transistors 45 and 53 while the output terminal Qs1 of the inverter 66 is connected to the gates of the transistors 50 and 55.

Figure 29:
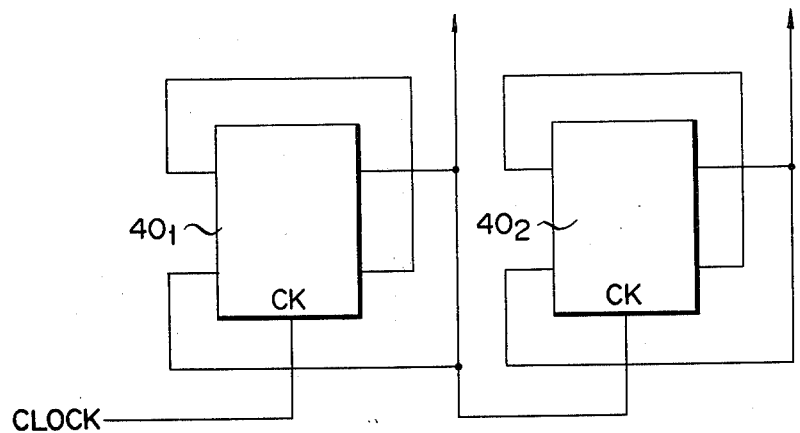
FIG. 29 shows a block diagram of the circuit shown in FIG. 28.

FIG. 29 shows a block diagram of the circuit shown in FIG. 28. As shown, the circuit of FIG. 28 is constructed as a ripple counter having a plurality of binary flip-flops connected in a cascade fashion in which the output data from a stage of the flip-flop is applied to the next stage as the clock input. When the given number (4 in this example) of the clock pulses are applied to the counter, the state of the counter returns to the initial stage.

In operation, it is assumed that the initial state of the circuit is: Clock=0, $Q_{s1}=1$ and $Q_{M1}=1$. When the clock changes from "0" to "1". The transistor 56 is turned on. The transistor 55 also is turned on since $Q_{s1}$ is "1". Accordingly, $Q_{M1}$ changes from "1" to "0", so that the transistor 68 is turned on. However, the transistor 69 has been On since Clock="1". As a result, $\overline{Q_{s1}}$="0" and $Q_{s1}$="1", and these states are held.

Figure 30:
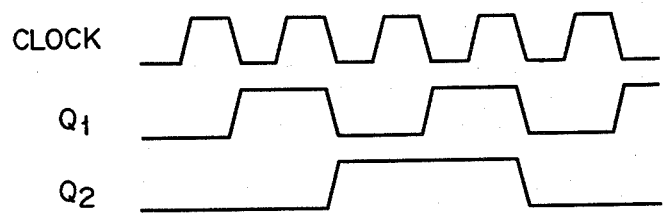
FIG. 30 shows a set of waveforms for illustrating the operation of the circuit in FIG. 28.

When the clock signal Clock changes from "1" to "0", the transistor 69 is turned on, so that $\overline{Q_{s1}}$ changes from "0" to "1". When Clock="1", $Q_{M1}$ has changed from "0" to "1", through the transistors 45 and 44, so that the transistor 64 is ON. The transistor 63 is ON since $\overline{Q_{s1}}$="1". Therefore, $Q_{s1}$ changes from "1" to "0". Subsequently, a similar operation is repeated. Through repetition of these steps, the operation waveforms as shown in FIG. 30 are produce. As seen from FIG. 30, this operation is similar to that of FIG. 2.

The operation of the FIG. 28 circuit may be tabulated in the following truth table. In the table, the upper row indicates the trailing edge synchronization while the lower row the leading edge synchronization.

| Clock | Qn+1 | $\overline{Qn+1}$ |
|---|---|---|
| 1 → 0 | $\overline{Qn}$ | Qn |
| 0 → 1 | $\overline{Qn}$ | Qn |

The output $Q_{s1}$ of the binary flip-flop $40_1$ serves as the clock input signal to the next stage of the binary flip-flop $40_2$. With the clock input signal Clock, the flip-flop $40_2$ operates as the binary flip-flop as in the flip-flop $40_1$, so that the circuit shown in FIG. 28 operates as a scale-of-4 counter.

As described above, the circuits of FIGS. 2 and 28 perform both the binary flip-flop operation. When comparing both the circuits in further detail, the circuit in FIG. 28 does not use the antiphase clock for the clock signal Clock, so that the inverter 231 using large transistors shown in FIG. 2 is not required, resulting in low power consumption and a high degree of integration. Accordingly, the circuit shown in FIG. 28 is useful particularly for a system operating at high speed or with the clock signal of high frequency.

With respect to the response times of $Q_{s1}$ and $\overline{Q_{s1}}$ to the clock signal Clock, when $\overline{Q_{s1}}$ changes from "0" to "1", Clock="0" and the transistor 69 is merely turned on. Accordingly, the response time corresponds to one stage of a transistor. At this time, $Q_{s1}$ changes from "1" to "0" since $\overline{Q_{s1}}$ becomes "1" and the transistor 63 is turned on. Accordingly, the response time of $\overline{Q_{s1}}$ corresponds to two stages of transistors. When the $\overline{Q_{s1}}$ changes from "1" to "0", the operation is completely symmetrical with the above-mentioned one. However, the response time likewise corresponds to two stages of transistors. The response time in this circuit is lowered by one stage, compared to the circuit in FIG. 2. Further, the circuit does not use the antiphase clock which causes the race problem in the circuit in FIG. 2, so that it does not suffer from a signal race.

By using the proper number of stages of the flip-flops, a $2^n$ scale counter may be constructed. In this case, the output signals from proper stages of the flip-flops are logically processed to detect a state of the counter. Through the logical process, when given counts are detected, the respective flip-flops are cleared.

A scale of 5 counter constructed based on this idea is shown in FIG. 31. The circuit in FIG. 31 is illustrated in block form in FIG. 32. As shown, the outputs from the flip-flops $40_1$ and $40_3$ of those flip-flops $40_1$, $40_2$ and $40_3$ are logically processed by the NAND gate 81. The output of the gate 81 clears the flip-flops at the respective stages. In this way, the scale-of-5 counter is formed. As seen from signal waveforms shown in FIG. 33, the counter returns to the original state after five clock signals are supplied thereto.

Figure 31A:
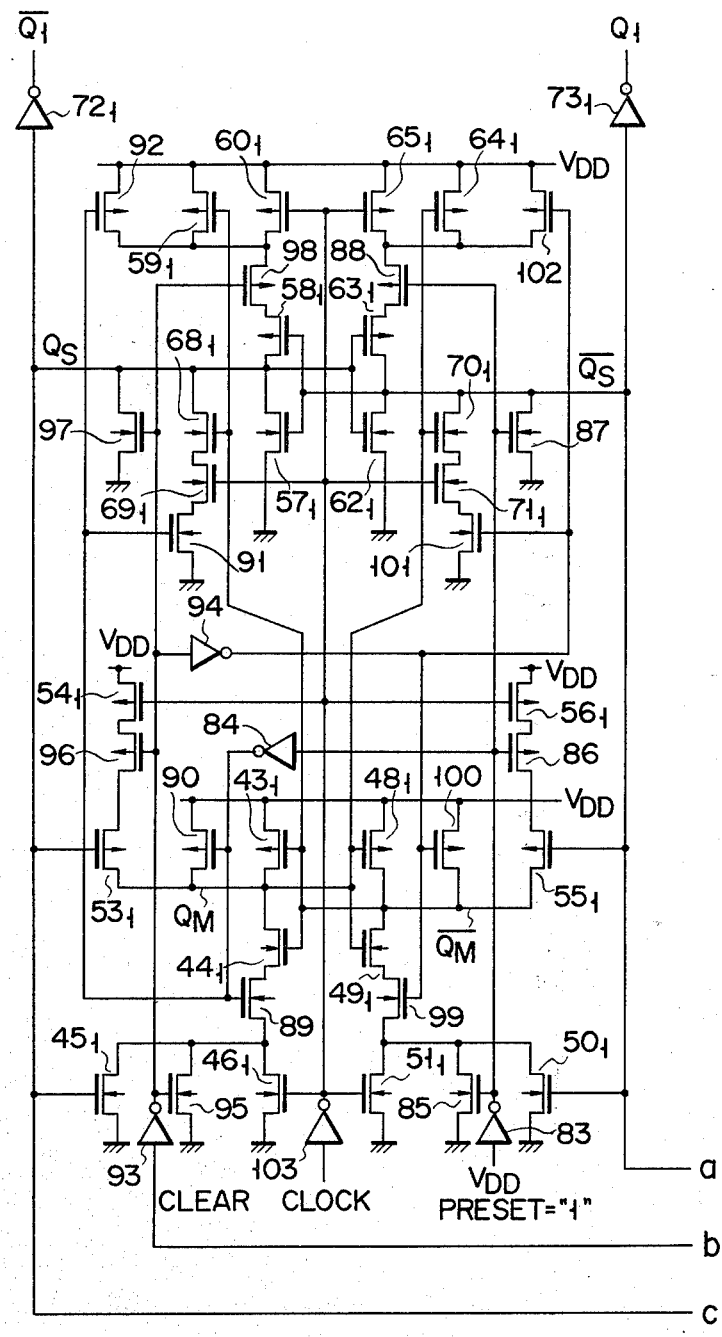
FIGS. 31(a) to 31(c) shows a circuit diagram when a scale of 5 counter is constructed by using the circuit shown in FIG. 28.
Figure 31B:
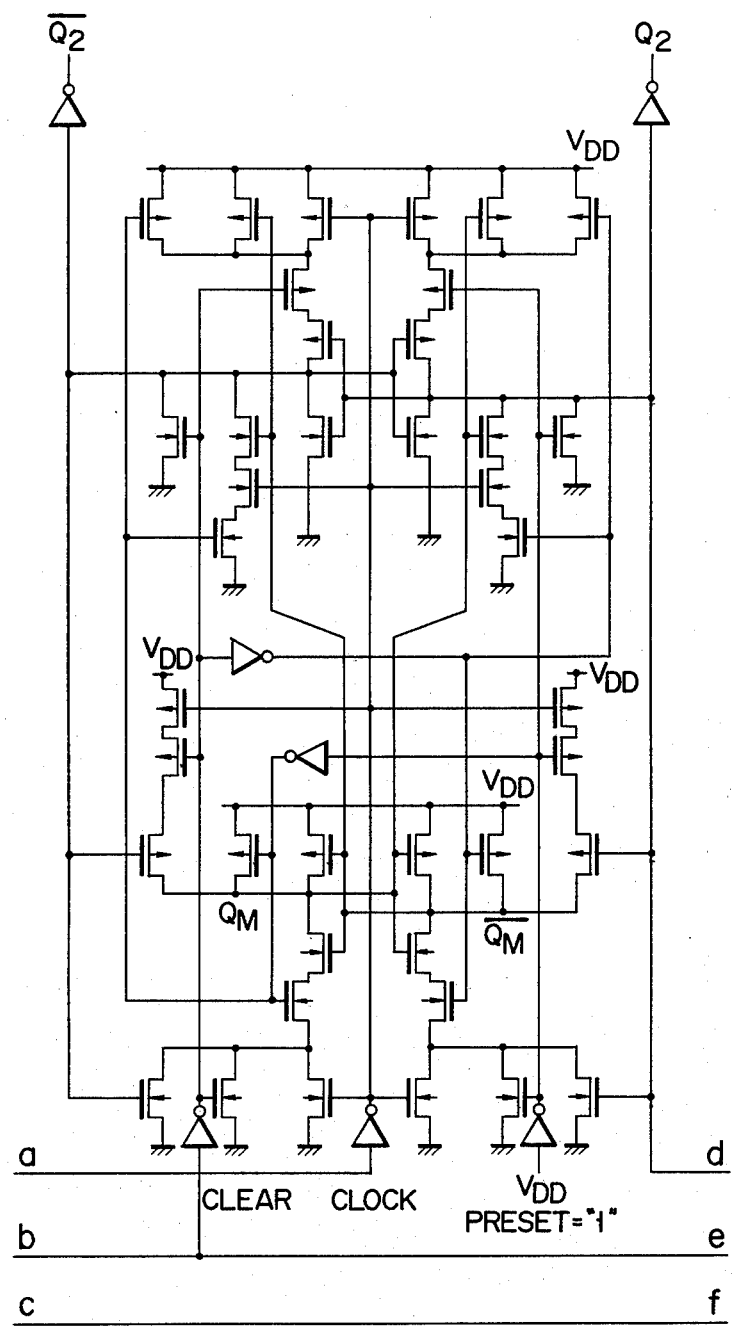
Figure 31C:
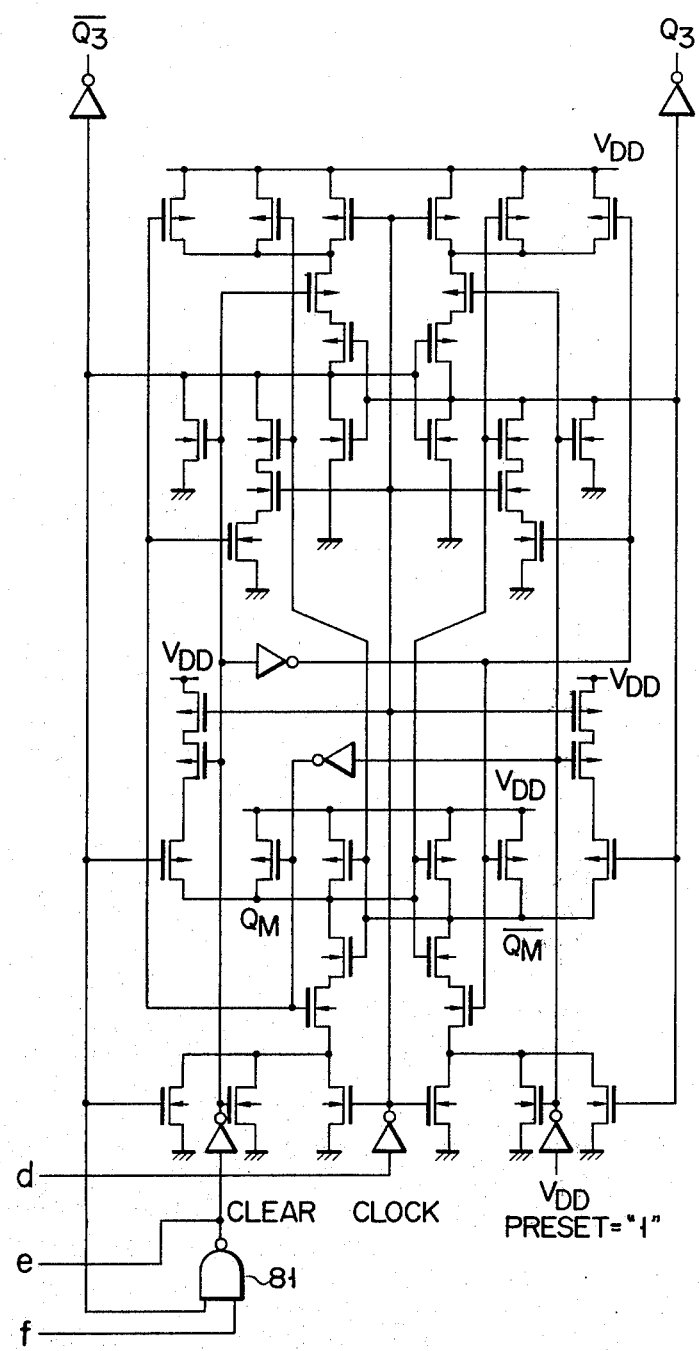

In FIGS. 31(a) to (c), the letters a to f are used and the portions designated by the same letters are connected with each other. The circuits in those figures additionally use elements for the preset/Clear function of the counter.

More specifically, to obtain the preset function, inverters 83 and 84, and transistors 85 to 92 are used to supply a preset signal Preset. Inverters 93 and 94 and transistors 95 to 102 are used to supply a clear signal. Further, an inverter 103 is used in the clock system. When Preset=1, neither the preset signal nor the clear signal is applied to the circuit. Further, this circuit uses the binary flip-flop of the leading edge synchronizing type in which the output data Q1, Q2 and Q3 changes at the leading edge of the clock signal Clock, unlike the embodiment mentioned above. Nevertheless, both embodiments are common in principle and accordingly like symbols with suffix "1" are used to designate like portions. The feature of this type flip-flop resides in that the clock signal Clock is supplied to N-channel transistors $69_1$ and $71_1$, for example, in order to change the data at the leading edge of the clock signal Clock.

FIG. 34 is a simplified embodiment of the circuit shown in FIG. 28. In this circuit, the transistors 45, 46, 50, 51, 59, 60, 64, 65, $45_1$, $46_1$, $50_1$, $51_1$, $59_1$, $60_1$, $64_1$ and $65_1$ are omitted from the circuit in FIG. 28. This circuit arrangement may also obtain the operation as illustrated in FIG. 30. It is evident that the circuit shown in FIGS. 31(a) to (c) may be simplified, as in the case of FIG. 34.

It should be understood that the invention is not limited to the embodiments as mentioned above. For example, the counter may be constructed by using other kinds of counters than the binary counter mentioned above in combination with the latter. In the above embodiment, the scale-of-$2^n$ counter is constructed by detecting the output data from a proper stage of the flip-flop as shown in FIG. 31. When the counters of the other kind are used, however, such a counter may be realized in a manner that the count outputs are detected and are used to reset, preset or clear the circuit or as a clock signal. In the specification, "to connect the flip-flops in a cascade fashion" means that the binary flip-flop at a stage is connected to that at the succeeding stage, and further that logical gates are inserted between adjacent flip-flops. This embodiment uses the binary flip-flops which are operable at high speed but with lower power consumption, are fabricated with a high degree of integration, and are free from the racing. Therefore, the counter of the invention enjoys the same beneficial effects as above.

What we claim is:

1. A flip-flop circuit comprising:
  a master flip-flop including a first logic gate circuit having a first input terminal and a first output terminal and a second logic gate circuit having a second input terminal and a second output terminal, said first input terminal being connected to said second output terminal and said second input terminal being connected to said first output terminal;
  a slave flip-flop including a third logic gate circuit having third and fourth input terminals and a third output terminal and a fourth logic gate circuit having fifth and sixth input terminals and a fourth output terminal, said third input terminal being connected to said fourth output terminal, said fifth input terminal being connected to said third output terminal, said fourth input terminal being connected to said first output terminal, and said sixth input terminal being connected to said second output terminal;
  first means for producing and supplying clock pulses to said master and said slave flip-flops;
  second means connected to said first, third and fourth logic gate circuits for producing a preset signal for predetermining the output of said slave flip-flop; and
  third means connected to said second, third, and fourth logic gate circuits for producing and supplying a clear signal for clearing the state of said master and said slave flip-flops.

2. A flip-flop circuit comprising:
  a first potential supply terminal;
  a master flip-flop including a first flip-flop element, said first flip-flop element including,
    (a) a first CMOS inverter having a first input terminal and a first output terminal, and
    (b) a second CMOS inverter having a second input terminal and a second output terminal; said first input terminal being connected to said second output terminal and said first output terminal being connected to said second input terminal
  a first series circuit comprising first and second MOS transistors of a first channel type connected between said first output terminal and said first potential supply terminal;
  a second series circuit comprising third and fourth MOS transistors of said first channel type connected between said second output terminal and said first potential supply terminal;
  a slave flip-flop including a second flip-flop element, said second flip-flop element including,
    (a) a third CMOS inverter having a third input terminal and a third output terminal, and
    (b) a fourth CMOS inverter having a fourth input terminal and a fourth output terminal, said third input terminal being connected to said fourth output terminal and said fourth input terminal being connected to said third output terminal;
  a second potential supply terminal;
  a third series circuit comprising fifth and sixth MOS transistors of a second channel type connected in series between said third output terminal and said second potential supply terminal;

a fourth series circuit comprising seventh and eighth MOS transistor of said second channel type connected in series between said fourth output terminal and said second potential supply terminal; and means for producing a clock signal and for supplying said clock signal to the gates of said second, fourth, sixth, and eighth MOS transistors, said first, second, third, and fourth output signals being supplied to the gates of said seventh, fifth, first, and third MOS transistors, respectively.

3. A flip-flop circuit comprising:
a first potential supply terminal;
a master flip-flop including a first flip-flop element comprising,
 (a) a first CMOS inverter including a first inverter series circuit having first and second MOS transistors, one of said first and second MOS transistors being of a first channel type and the other of said first and second MOS transistors being of a second channel type, a first input terminal, and a first output terminal, and
 (b) a second CMOS inverter including a second inverter series circuit having third and fourth MOS transistors, one of said third and fourth MOS transistors being of the first channel type and the other of said third and fourth MOS transistors being of the second channel type, a second input terminal connected to said first output terminal, and a second output terminal connected to said first terminal;
a first series circuit comprising fifth and sixth MOS transistors of said second channel type connected between said first output terminal and said first potential supply terminal;
a second series circuit comprising seventh and eighth MOS transistors of said second channel type connected in series between said second output terminal and said first potential supply terminal;
a slave flip-flop including a second flip-flop element comprising,
 (a) a third CMOS inverter including a third inverter series circuit having ninth and tenth MOS transistors, one of said ninth and tenth MOS transistors being of said first channel type and the other of said ninth and tenth MOS transistors being of said second channel type, a third input terminal and a third output terminal and
 (b) a fourth CMOS inverter including a fourth inverter series circuit having eleventh and twelfth MOS transistors, one of said eleventh and twelfth MOS transistors being of a first channel type and the other of said eleventh and twelfth MOS transistors being of a second channel type, a fourth input terminal connected to said third output terminal and a fourth output terminal connected to said third input terminal;
a second potential supply terminal;
a third series circuit comprising thirteenth and fourteenth MOS transistors of said second channel type connected in series between said third output terminal and said second potential supply terminal;
a fourth series circuit having fifteenth and sixteenth MOS transistors of said first channel type connected in series between said fourth output terminal and said second potential supply terminal;

means for producing clock pulses and for supplying said clock pulses to the gates of said sixth, eighth, fourteenth, and sixteenth MOS transistors, and first output terminal being connected to the gate of said fifteenth MOS transistor, said second output terminal being connected to the gate of said thirteenth MOS transistor, said third output terminal being connected to the gate of said fifth MOS transistor, and said fourth output terminal being connected to the gate of said seventh MOS transistor.

4. A flip-flop circuit according to claim 2 or 3 wherein said master flip-flop and said slave flip-flop are cascade-connected in a ring fashion.

5. A flip-flop circuit according to claim 4 further including means for resetting said master flip-flop and said slave flip-flop to their original states responsive to a predetermined number of clock pulses.

6. A flip-flop circuit comprising:
a master flip-flop including a first logic gate circuit having a first input terminal and a first output terminal and a second logic gate circuit having a second input terminal and a second output terminal, said first input terminal being connected to said second output terminal and said second input terminal being connected to said second output terminal;
a slave flip-flop including a third logic gate circuit having third and fourth input terminals and a third output terminal and a fourth logic gate circuit having fifth and sixth input terminals and a fourth output terminal, said third input terminal being connected to said fourth output terminal, said fifth input terminal being connected to said third output terminal, said fourth input terminal being connected to said first output terminal, and said sixth input terminal being connected to said second output terminal;
first means for producing and supplying clock pulses to said master and slave flip-flops; and
second means connected to said first, third, and fourth logic gate circuits for producing a preset signal for determining the output of said slave flip-flop, said preset signal having a first signal value, said first signal value of said preset signal being supplied to said first and fourth logic gate circuits and wherein said flip-flop circuit further includes a first inverter coupled to said second means for inverting said first signal value of said preset signal to produce an inverted preset signal having a second signal value, said inverted preset signal being supplied to said third logic gate circuit.

7. A flip-flop circuit comprising:
a master flip-flop including a first logic gate circuit having a first input terminal and a first output terminal and a second logic gate circuit having a second input terminal and a second output terminal, said first input terminal being connected to said second output terminal and said second input terminal being connected to said first output terminal;
a slave flip-flop including a third logic gate circuit having third and fourth input terminals and a third output terminal and a fourth logic gate circuit having fifth and sixth input terminals and a fourth output terminal, said third input terminal being connected to said fourth output terminal, said fifth input terminal being connected to said third output terminal, said fourth input terminal being connected to said first output terminal, and said sixth input terminal being connected to said second output terminal;

first means for producing and supplying clock pulses to said master and slave flip-flops;

second means connected to said first, third, and fourth logic gate circuits for producing a preset signal for determining the output of said slave flip-flop; and a fifth logic gate circuit having seventh and eighth input terminals and a fifth output terminal, said seventh input terminal being connected to said second means for receiving said preset signal and said eighth input terminal being connected to said fourth output terminal.

8. A flip-flop circuit comprising:

a master flip-flop including a first logic gate circuit having a first input terminal and a first output terminal and a second logic gate circuit having a second input terminal and a second output terminal, said first input terminal being connected to said second output terminal and said second input terminal being connected to said first output terminal;

a slave flip-flop including a third logic gate circuit having third and fourth input terminals and a third output terminal and a fourth logic gate circuit having fifth and sixth input terminals and a fourth output terminal, said third input terminal being connected to said fourth output terminal, said fourth input terminal being connected to said first output terminal, said fifth input terminal being connected to said third output terminal, and said sixth input terminal being connected to said second output terminal;

first means for producing clock pulses and for supplying said produced clock pulses to said master and slave flip-flops; and second means connected to said second, third, and fourth logic gate circuits for producing a clear signal for clearing the states of said master and slave flip-flops, said clear signal having a first signal value, said first signal value of said clear signal being supplied to said second and third logic gate circuits, and wherein said flip-flop circuit further includes an inverter circuit coupled to said second means to produce an inverted clear signal having a second signal value, said inverted clear signal being supplied to said fourth logic gate circuit.

9. A flip-flop circuit according to claim 8, further comprising:

a fifth logic gate circuit having seventh and eighth input terminals and a fifth output terminal, said seventh input terminal being connected to said third output terminal and said eighth input terminal being connected to said second producing means.

10. A flip-flop circuit comprising:

a master flip-flop including a first logic gate circuit having a first input terminal and a first output terminal and a second logic gate circuit having a second input terminal and a second output terminal, said first input terminal being connected to said second output terminal and said second input terminal being connected to said first output terminal;

a slave flip-flop including a third logic gate circuit having third and fourth input terminals and a third output terminal and a fourth logic gate circuit having fifth and sixth input terminals and a fourth output terminal, said third input terminal being connected to said fourth output terminal, said fifth input terminal being connected to said third output terminal, said fourth input terminal being connected to said first output terminal, and said sixth input terminal being connected to said second output terminal;

first means for producing and supplying clock pulses to said master and said slave flip-flops;

second means connected to said first, third, and fourth logic gate circuits for producing a preset signal for predetermining the output of said slave flip-flop;

third means connected to said second, third, and fourth logic gate circuits for producing and supplying a clear signal for clearing the state of said master and said slave flip-flop; and a fifth logic gate circuit having seventh, eighth, and ninth input terminals, said seventh input terminal for receiving said preset signal, said eighth input terminal for receiving said clear signal, and said ninth input terminal being connected to said third input terminal.

* * * * *

UNITED STATES PATENT AND TRADEMARK OFFICE
CERTIFICATE OF CORRECTION

PATENT NO. : 4,356,411

DATED : October 26, 1982

INVENTOR(S) : YASOJI SUZUKI ET AL.

It is certified that error appears in the above—identified patent and that said Letters Patent is hereby corrected as shown below:

Claim 2, Col. 19, line 4, change "transistor" to --transistors--.

Claim 3, Col. 19, line 32, after "first" insert --input--.

Claim 3, Col. 20, line 3, change "and" (second occurrence) to --said--.

Signed and Sealed this

Fifth Day of April 1983

[SEAL]

*Attest:*

*Attesting Officer*

GERALD J. MOSSINGHOFF

*Commissioner of Patents and Trademarks*